(12) United States Patent
Tao et al.

(10) Patent No.: US 9,422,472 B2
(45) Date of Patent: *Aug. 23, 2016

(54) RED-EMITTING NITRIDE-BASED PHOSPHORS

(71) Applicant: Intematix Corporation, Fremont, CA (US)

(72) Inventors: Dejie Tao, Fremont, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 27 days.

This patent is subject to a terminal disclaimer.

(21) Appl. No.: 14/196,556

(22) Filed: Mar. 4, 2014

(65) Prior Publication Data

US 2014/0361681 A1 Dec. 11, 2014

Related U.S. Application Data

(63) Continuation of application No. 13/871,961, filed on Apr. 26, 2013, now Pat. No. 8,663,502, and a continuation-in-part of application No. 13/732,222, filed on Dec. 31, 2012, now Pat. No. 8,951,441.

(60) Provisional application No. 61/673,191, filed on Jul. 18, 2012, provisional application No. 61/582,198, filed on Dec. 30, 2011.

(51) Int. Cl.
| | |
|---|---|
| C09K 11/59 | (2006.01) |
| C09K 11/77 | (2006.01) |
| H05B 33/12 | (2006.01) |
| C09K 11/08 | (2006.01) |
| H05B 33/14 | (2006.01) |
| H01L 33/50 | (2010.01) |

(52) U.S. Cl.
CPC ......... *C09K 11/7728* (2013.01); *C09K 11/0883* (2013.01); *C09K 11/7731* (2013.01); *C09K 11/7734* (2013.01); *H05B 33/12* (2013.01); *H05B 33/14* (2013.01); *H01L 33/504* (2013.01); *H01L 2924/0002* (2013.01)

(58) Field of Classification Search
CPC ............ H01L 33/502; C09K 11/0883; C09K 11/7721; C09K 11/7734
See application file for complete search history.

(56) References Cited

U.S. PATENT DOCUMENTS

| | | | |
|---|---|---|---|
| 3,207,583 A | 9/1965 | Brautigam et al. | |
| 6,649,946 B2 | 11/2003 | Bogner et al. | |
| 6,670,748 B2 | 12/2003 | Ellens et al. | |
| 6,956,247 B1 | 10/2005 | Stockman | |
| 7,026,755 B2 | 4/2006 | Setlur et al. | |
| 7,138,756 B2 | 11/2006 | Gotoh et al. | |
| 7,229,573 B2 | 6/2007 | Setlur et al. | |
| 7,252,787 B2 | 8/2007 | Hancu et al. | |
| 7,252,788 B2 | 8/2007 | Nagatomi et al. | |
| 7,258,816 B2 | 8/2007 | Tamaki | |
| 7,311,858 B2 | 12/2007 | Wang et al. | |
| 7,345,418 B2 | 3/2008 | Nagatomi et al. | |
| 7,476,337 B2 | 1/2009 | Sakane et al. | |
| 7,476,338 B2 | 1/2009 | Sakane et al. | |
| 7,507,354 B2 | 3/2009 | Oshio | |
| 7,537,710 B2 | 5/2009 | Oshio | |
| 7,540,977 B2 | 6/2009 | Hirosaki et al. | |
| 7,556,744 B2 | 7/2009 | Tamaki et al. | |
| 7,575,679 B2 | 8/2009 | Sumino et al. | |
| 7,597,823 B2 | 10/2009 | Tamaki et al. | |
| 7,671,529 B2 | 3/2010 | Mueller et al. | |
| 7,700,002 B2 | 4/2010 | Schmidt et al. | |
| 7,713,443 B2 | 5/2010 | Hirosaki et al. | |
| 7,854,859 B2 | 12/2010 | Kameshima et al. | |
| 8,062,549 B2 | 11/2011 | Nagatomi et al. | |

(Continued)

FOREIGN PATENT DOCUMENTS

| | | |
|---|---|---|
| CN | 1824728 A | 8/2006 |
| CN | 1874019 A | 12/2006 |
| CN | 1938870 A | 3/2007 |
| CN | 101146890 A | 3/2008 |
| CN | 101151348 A | 3/2008 |
| CN | 101157854 A | 4/2008 |
| CN | 102066522 A | 5/2011 |
| CN | 102433114 A | 5/2012 |
| CN | 102544326 A | 7/2012 |
| EP | 1568753 A2 | 8/2005 |

(Continued)

OTHER PUBLICATIONS

Hoppe, A., et al., "Luminescence in $Eu^{2+}$/doped $Ba_2Si_5N_8$: Fluorescence, Thermoluminescence, and Upconversion", J. of Phys. Chem. Solids, vol. 61, 2000, pp. 2001/2006.

(Continued)

*Primary Examiner* — Carol M Koslow
(74) *Attorney, Agent, or Firm* — David H. Jaffer; Pillsbury Winthrop Shaw Pittman LLP

(57) ABSTRACT

A red-emitting phosphor comprises a nitride-based composition represented by the chemical formula $M_{(x/v)}M'_2Si_{5-x}Al_xN_8$:RE, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies $0.1 \leq x < 0.4$, and wherein the phosphor has the general crystalline structure $M'_2Si_5N_8$:RE, Al substitutes for Si within the crystalline structure, and M is located substantially at interstitial sites. Furthermore, the phosphor is configured such that 1,000 hours of aging at 85° C. and 85% humidity results in a deviation in chromaticity coordinates CIE Δx and Δy of less than about 0.03. Furthermore, the phosphor absorbs radiation in the UV and blue and emits light with a photoluminescence peak wavelength within the range from about 620 to 650 nm.

16 Claims, 25 Drawing Sheets

(56) References Cited

U.S. PATENT DOCUMENTS

| | | | |
|---|---|---|---|
| 8,076,847 B2 | 12/2011 | Tamaki et al. | |
| 8,153,025 B2 | 4/2012 | Schmidt et al. | |
| 8,178,001 B2 | 5/2012 | Kaneda et al. | |
| 8,475,683 B2 | 7/2013 | Li et al. | |
| 8,597,545 B1 * | 12/2013 | Liu | C09K 11/0883 252/301.4 F |
| 8,663,502 B2 * | 3/2014 | Tao | C09K 11/0883 252/301.4 F |
| 8,951,441 B2 * | 2/2015 | Li | C09K 11/0883 252/301.4 F |
| 2005/0189863 A1 | 9/2005 | Nagatomi et al. | |
| 2006/0017365 A1 | 1/2006 | Nagatomi et al. | |
| 2006/0027786 A1 | 2/2006 | Dong et al. | |
| 2006/0145123 A1 | 7/2006 | Li et al. | |
| 2006/0255710 A1 | 11/2006 | Mueller/Mach et al. | |
| 2007/0007494 A1 | 1/2007 | Hirosaki et al. | |
| 2007/0029526 A1 | 2/2007 | Cheng et al. | |
| 2007/0040152 A1 | 2/2007 | Oshio | |
| 2007/0182309 A1 | 8/2007 | Wang et al. | |
| 2007/0257596 A1 | 11/2007 | Shimomura et al. | |
| 2008/0001126 A1 | 1/2008 | Hirosaki | |
| 2008/0081011 A1 | 4/2008 | Oshio | |
| 2008/0116786 A1 | 5/2008 | Wang et al. | |
| 2008/0128726 A1 | 6/2008 | Sakata et al. | |
| 2008/0143246 A1 | 6/2008 | Hirosaki et al. | |
| 2008/0303409 A1 | 12/2008 | Hirosaki et al. | |
| 2009/0114929 A1 | 5/2009 | Lee et al. | |
| 2009/0166584 A1 | 7/2009 | Shimooka et al. | |
| 2009/0243467 A1 | 10/2009 | Shimizu et al. | |
| 2009/0251044 A1 | 10/2009 | Shioi | |
| 2009/0267485 A1 | 10/2009 | Nagatomi et al. | |
| 2009/0283721 A1 | 11/2009 | Liu et al. | |
| 2009/0309112 A1 | 12/2009 | Yoshimatsu | |
| 2009/0322209 A1 | 12/2009 | Becker et al. | |
| 2009/0322990 A1 | 12/2009 | Kawana et al. | |
| 2010/0039020 A1 | 2/2010 | Hirosaki | |
| 2010/0044729 A1 | 2/2010 | Naum et al. | |
| 2010/0052515 A1 | 3/2010 | Watanabe et al. | |
| 2010/0085728 A1 | 4/2010 | Seto et al. | |
| 2010/0123104 A1 | 5/2010 | Collins et al. | |
| 2010/0187974 A1 | 7/2010 | Zhang et al. | |
| 2010/0213822 A1 | 8/2010 | Shimooka et al. | |
| 2010/0288972 A1 | 11/2010 | Roesler et al. | |
| 2010/0296024 A1 | 11/2010 | Ishimaru et al. | |
| 2011/0001154 A1 | 1/2011 | Kim et al. | |
| 2011/0031874 A1 | 2/2011 | Hosokawa et al. | |
| 2011/0176084 A1 | 7/2011 | Akiho et al. | |
| 2012/0104929 A1 | 5/2012 | Yeh et al. | |
| 2012/0112130 A1 | 5/2012 | Wu et al. | |
| 2012/0194060 A1 | 8/2012 | Schmidt | |
| 2012/0262904 A1 | 10/2012 | Van Woundenberg et al. | |
| 2013/0092964 A1 | 4/2013 | Li et al. | |
| 2013/0127332 A1 | 5/2013 | Chen et al. | |
| 2013/0168605 A1 | 7/2013 | Li et al. | |

FOREIGN PATENT DOCUMENTS

| | | |
|---|---|---|
| EP | 1837386 A1 | 9/2007 |
| EP | 1873225 | 1/2008 |
| EP | 1884552 | 2/2008 |
| EP | 1887067 | 2/2008 |
| EP | 1964906 A1 | 9/2008 |
| EP | 2009077 | 12/2008 |
| EP | 2058382 | 5/2009 |
| EP | 2264762 A2 | 12/2010 |
| EP | 2471890 | 7/2012 |
| JP | 2003-124527 A | 4/2003 |
| JP | 2003-321675 | 11/2003 |
| JP | 2006-070109 A | 7/2004 |
| JP | 2004/244560 | 9/2004 |
| JP | 2005/226000 A | 8/2005 |
| JP | 2006-41096 A | 2/2006 |
| JP | 2008/163259 A | 7/2008 |
| JP | 2010-518194 A | 5/2010 |
| JP | 4543251 | 7/2010 |
| JP | 4822657 B2 | 11/2011 |
| JP | 2012-046626 A | 3/2012 |
| JP | 2012-069572 | 4/2012 |
| JP | 2012-114333 A | 6/2014 |
| KR | 10/2010/0086964 | 8/2010 |
| TV | 201002802 A | 1/2010 |
| TW | 200919021 A | 5/2009 |
| TW | 200921958 A | 5/2009 |
| TW | I317756 | 12/2009 |
| WO | WO 2006/073141 A1 | 7/2006 |
| WO | WO 2008096300 A1 | 8/2008 |

OTHER PUBLICATIONS

Li et al., "Luminescence properties of red/emitting $M_2Si_5N_8:Eu^{2+}$ (M=Ca, Sr, Ba) LED conversion phosphors," J. of Alloys and Compounds, 2006, pp. 273/279, vol. 417.

Piao, S., et al., "Synthesis and Luminescent Properties of Low Oxygen Contained $Eu^{2+}$/doped Ca/α/SiAlON Phosphor from Calcium Cyanamide Reduction", Journal of Rare Earths, 26(2), Apr. 2008, pp. 198/202.

Uheda, K. et al., "Luminescence properties of a red phosphor, $CaAlSiN_3$: $Eu^{2+}$, for white light/emitting diodes," Electrochemical and Solid/State Letters, 2006, pp. H22/H25, vol. 9, No. 4.

Van Krevel, J.W.H., On New Rare/Earth Doped M/Si/Al/O/N Materials: Luminescence Properties and Oxidation Resistance, Thesis, Chapters 1/3, 2000, pp. 1/43.

Xie, Rong/Jun et al., "Silcon/based oxynitride and nitride phosphors for white LEDs—a review," Science and Technology of Advanced Materials, Oct. 23, 2007, pp. 588/600, vol. 8.

Hampshire, et al., "Silicon Nitride Ceramics/Review of Structure, Processing and Properties," Journal of Achievements in Mats. and Manufacturing Engineering, 24(1), Sep. 2007, pp. 43/50.

Hecht, Cora "SrALS14N7:EU2+ / a Nitridoaluminosilicate Phosphor for Warm White Light . . . ", Chem. Mater, 21, 2009, pp. 1595/1601.

Huang, et a., "Formation of α/$Si_3N_4$ Solid Solutions in the System $Si_3N_4$/AlN/$Y_2O_3$", Comm. of the American Cerm. Soc., Jun. 1983, C96-C97.

Piao, et al., "Preparation of $(Sr_{1/X}Ca_X)2Si_5N_8:Eu^{2+}$ Solid Solutions and Their Luminescence Properties,", J. of the Electrochem. Soc., 152(12), 2006, pp. H232/H235.

Ruan, J., et al., "Nitrogen Gas Pressure Synthesis and Photoluminescent Properties of Orange/Red SrALSi4N7:Eu2+ Phosphors for White Light Emitting Diodes", J. Am. Ceram. Soc, 94(2), 2011, pp. 536/542.

Shioi, K., et al., "Synthesis Crystal Structure and Photoluminescence of Sr/α/SiAlON:$Eu^{2+}$", J. Am. Ceramic Soc., 93(2), 2010, pp. 465/469.

Xie, et al., "A Simple, Efficient Synthetic Route to $Sr_2Si_5N_8$: $Eu^{2+}$/based Red Phosphors for White Light/Emitting Diodes", Chem. Mater., 18, 2006, pp. 5578/5583.

International Search Report and Written Opinion issued in PCT/US2012/072336 on Apr. 22, 2013.

International Search Report and Written Opinion issued Oct. 22, 2013 in corresponding PCT/US2013/050885.

International Search Report and Written Opinion issued Apr. 22, 2013 in PCT/US2012/072336.

* cited by examiner

RED-EMITTING NITRIDE-BASED PHOSPHORS

CROSS-REFERENCE TO RELATED APPLICATIONS

This application is a continuation of U.S. patent application Ser. No. 13/871,961 filed Apr. 26, 2013 (now U.S. Pat. No. 8,663,502), which claims the benefit of U.S. Provisional Application No. 61/673,191 filed Jul. 18, 2012, and is a continuation-in-part of, and claims priority to U.S. Ser. No. 13/732,222 filed Dec. 31, 2012 (now U.S. Pat. No. 8,951,441), which claims priority to U.S. Provisional Application No. 61/582,198 filed Dec. 30, 2011. The disclosures of the aforementioned applications are all incorporated by reference in their entirety herein.

FIELD OF THE INVENTION

Embodiments of the present invention are directed to red-emitting nitride-based phosphor compositions.

BACKGROUND OF THE INVENTION

Many of the red-emitting phosphors are derived from silicon nitride ($Si_3N_4$). The structure of silicon nitride comprises layers of Si and N bonded in a framework of slightly distorted $SiN_4$ tetrahedra. The $SiN_4$ tetrahedra are joined by a sharing of nitrogen corners such that each nitrogen is common to three tetrahedra. See, for example, S. Hampshire in "Silicon nitride ceramics—review of structure, processing, and properties," *Journal of Achievements in Materials and Manufacturing Engineering*, Volume 24, Issue 1, September (2007), pp. 43-50. Compositions of red-emitting phosphors based on silicon nitride often involve substitution of the Si at the center of the $SiN_4$ tetrahedra by elements such as Al; this is done primarily to modify the optical properties of the phosphors, such as the intensity of the emission, and the peak emission wavelength.

There is a consequence of the aluminum substitution, however, which is that since $Si^{4+}$ is being replaced by $Al^{3+}$, the substituted compound develops a missing positive charge. There are essentially two ways commonly employed to achieve charge balance: in one scheme, an $Al^{3+}$ for $Si^{4+}$ substitution is accompanied by a substitution of $O^{2-}$ for $N^{3-}$, such that the missing positive charge is counter-balanced with a missing negative charge. This leads to a network of tetrahedra that have either $Al^{3+}$ or $Si^{4+}$ as the cations at the centers of the tetrahedra, and a structure whereby either an $O^{2-}$ or an $N^{3-}$ anion is at the corners of the tetrahedra. Since it is not known precisely which tetrahedra have which substitutions, the nomenclature used to describe this situation is $(Al,Si)_3$—$(N,O)_4$. Clearly, for charge balance there is one O for N substitution for each Al for Si substitution.

Furthermore, these substitutional mechanisms for charge balance—O for N—may be employed in conjunction with an interstitial insertion of a cation. In other words, the modifying cation is inserted between atoms preexisting on crystal lattice sites, into "naturally occurring" holes, interstices, or channels. This mechanism does not require an altering of the anionic structure (in other words, a substitution of O for N), but this is not to say that an O for N substitution may not simultaneously occur. Substitutional mechanisms for charge balance may occur in conjunction with an interstitial insertion of a modifier cation.

The use of modifying cations in a nitride phosphor of Sr-containing α-SiAlONs have been discussed by K. Shioi et al. in "Synthesis, crystal structure, and photoluminescence of Sr-α-SiAlON:$Eu^{2+}$," *J. Am. Ceram. Soc.*, 93 [2] 465-469 (2010). Shioi et al. give the formula for the overall composition of this class of phosphors: $M_{m/v}Si_{12-m-n}Al_{m+n}O_nN_{16-n}$: $Eu^{2+}$, where M is a "modifying cation" such as Li, Mg, Ca, Y, and rare earths (excluding La, Ce, Pr, and Eu), and v is the valence of the M cation. As taught by Shioi et al., the crystal structure of an α-SiAlON is derived from the compound α-$Si_3N_4$. To generate an α-SiAlON from α-$Si_3N_4$, a partial replacement of $Si^{4+}$ ions by $Al^{3+}$ ions takes place, and to compensate for the charge imbalance created by $Al^{3+}$ substituting for $Si^{4+}$, some O substitutes N and some positive charges are added (what Shioi et al. refer to as "stabilization") by trapping the M cations into the interstices within the network of (Si,Al)—$(O,N)_4$ tetrahedra.

Europium doped alkaline earth metal silicon nitride phosphor with the general formula $M_2Si_5N_8$, where M is Ca, Sr, or Ba, have been widely studied, see for example the PhD thesis by JWH van Krevel at the Technical University Eindhoven, January 2000, U.S. Pat. No. 6,649,946, and H. A. Hoppe, et al., J. Phys. Chem. Solids. 2000, 61:2001-2006. This family of phosphors emits at wavelengths from 600 nm to 650 nm with high quantum efficiency. Among them, pure $Sr_2Si_5N_8$ had the highest quantum efficiency and emitted at a peak wavelength about 620 nm. It is well known that this red nitride phosphor has poor stability under the conditions wherein the LED is operated at a temperature ranging from 60° C. to 120° C. and an ambient relative humidity ranging from 40% to 90%.

Various groups have experimented with oxygen-containing $M_2Si_5N_8$ based materials, which may also contain other metals. For example, see U.S. Pat. Nos. 7,671,529 and 6,956,247, and U.S. published applications 2010/0288972, 2008/0081011, and 2008/0001126. However, these oxygen containing materials are known to exhibit poor stability under the combined conditions of high temperature and high relative humidity (RH)—for example 85° C. and 85% RH.

The forms of charge compensation reported in the art are not believed to render the phosphor more impervious to thermal/humidity aging, nor do they appear to accomplish the beneficial result of increasing the peak emission wavelength with little or substantially no alteration of photoemission intensity.

There is a need for stabilized silicon nitride-based phosphors and stabilized $M_2Si_5N_8$-based phosphors with: peak emission wavelengths over a wider range in the red and also other colors; and with enhanced physical properties of the phosphor, such as temperature and humidity stability.

SUMMARY OF THE INVENTION

Embodiments of the present invention provide nitride-based phosphors with chemical composition based on $M_2Si_5N_8$ with column IIIB elements, particularly Al, substituting for Si, and cations substantially substitutionally interstitially incorporated into the phosphor crystal structure for charge balance. These phosphor materials may be configured to extend the peak emission wavelength to longer wavelengths in the red, and to enhance physical properties of the phosphor—notably, significant improvement of the temperature and humidity stability.

Some embodiments of the present invention are directed to a nitride-based phosphor composition represented by the general formula $M'_xM''_2A_{5-y}D_yE_8$:RE. Here, M' is at least one of a 1+ cation, a 2+ cation, and a 3+ cation, and M'' is at least one of Mg, Ca, Sr, Ba, and Zn. A is at least one of Si, C and Ge. The element D replaces the A component substitutionally, where D is elected from the group consisting of column IIIB elements of the periodic table. In one embodiment, D is at least one of B, Al, and Ga. To charge compensate for the substitution of D for A, a modifier cation M' is added to the phosphor. M' is at least one of $Li^{1+}$, $Na^{1+}$, $K^{1+}$, $Sc^{3+}$, $Ca^{2+}$, $Mg^{2+}$, $Sr^{2+}$, $Ba^{2+}$ and $Y^{3+}$, and this modifier cation is inserted into the phosphor substantially interstitially. E is at least one of a 3− anion, a 2− anion, and a 1− anion, and may be at least one of $O^{2-}$, $N^{3-}$, $F^{1-}$, $Cl^{1-}$, $Br^{1-}$, and $I^{1-}$. The rare earth activator RE is at least one of Eu, Ce, Tb, Pr, and Mn; and y is given by $0.01 \leq y < 4$, and x times the valence of M' is equal to y.

Herein RE represents a phosphor activator and the notation ":RE" represents doping by a rare earth which is generally substitutional, but may also include doping at grain boundaries, on particle surfaces and in interstitial sites within the crystalline structure of the phosphor material. Generally, the crystalline structures of the 2-5-8 nitride-based compounds as described herein may have a space group selected from $Pmn2_1$, Cc, derivatives thereof, or mixtures thereof. In some examples, the space group is $Pmn2_1$. Furthermore, it should be noted that in materials science theory the vacancy density of a pure crystalline material may be on the order of a hundred parts per million of the existing lattice sites depending on the thermal equilibrium conditions of the crystal. As such, a small percentage of the charge balance ions may actually end up in vacant metal ion sites, rather than the interstitial sites—the charge balance ions filling the vacancies before the interstitial sites.

In alternative embodiments, the modifier cation M' residing in the crystal interstitially is selected from the group consisting of an alkaline earth, including $Ca^{2+}$, and the elements $Li^{1+}$, $Y^{3+}$, $Mn^{2+}$, $Zn^{2+}$, and one or more rare earths (RE), each of the interstitially placed modifier cations may be used either individually or in combinations. This is the case as long as the sum of the modifier cations valencies equals the charge imbalance caused by the column IIIB element substitution for A.

It may be immediately seen that a phosphor under examination has modifier cations added substantially interstitially in the present phosphors because the stoichiometric subscript on the cations will be greater than 2. A traditional $M_2Si_5N_8$ red-emitting phosphor has a subscript that is equal to 2. When this number is greater than 2, it may be concluded that the excess cations do not reside on occupied crystalline lattice sites; rather, the added modifier cations are inserted into the interstices, holes, or channels that exist "naturally" in the crystalline structure of the host phosphor. These interstices may be unoccupied lattice sites.

The $Si^{4+}$ substitution being charge balanced by the inclusion of a substantially interstitially placed modifier cation as per the present invention has the unexpected benefit that the peak emission wavelength is increased, towards the red end of the spectrum. According to some embodiments, this increase is equal to or greater than about 6 nm. An unexpected result that occurs in conjunction with the emission wavelength increase is a substantial maintaining of the photoemission intensity. According to some embodiments, the decrease in intensity seen with the substitutional and interstitial modifications is less than 10%, relative to the intensity prior to the modifications being made.

The $Si^{4+}$ substitution being charge balanced by the inclusion of a substantially interstitially placed modifier cation as per the present invention has the unexpected benefit that the stability of the phosphor is enhanced under conditions of aging at elevated temperature and humidity. The phosphor is compositionally configured such that the deviation in photoluminescent intensity after 1,000 hours of aging at 85° C. and 85% humidity is no greater than about 30%. The phosphor is further compositionally configured such that the deviation in chromaticity coordinates CIE Δx and CIE Δy after 1,000 hours of aging at 85° C. and 85% humidity is less than or equal to about 0.03 for each coordinate.

In another embodiment of the present invention, the interstitial modifier cation charge balancing for the $Si^{4+}$ substitution is accompanied by some degree of a substitution of $O^{2-}$ for $N^{3-}$. In other words, in this embodiment, the charge balancing mechanism of a substantially interstitially placed modifier cation only partially balances the charge imbalance, and the $O^{2-}$ for $N^{3-}$ accomplishes the remainder. The reason for the "incomplete" charge balance may be that the modifier cations have a lower valence than otherwise would be the case, such as when $Li^+$ and $Ca^{2+}$ are used instead of $Ca^{2+}$ and $Y^{3+}$. Alternatively, the choice of modifier cations are such that the valence is high (2+, 3+, or even 5+ cations), and the charge balance is incomplete because fewer modifying cations are placed.

According to the present embodiments, the phosphor is configured to emit light having a wavelength greater than about 600 nm under blue excitation, where blue may be defined as light having a wavelength ranging from about 420 nm to about 470 nm. The present phosphors may also be excited by radiation having shorter wavelengths; e.g., from about 250 nm to about 420 nm, but when the excitation radiation is in the x-ray or UV, a separate blue-emitting phosphor is provided to contribute a blue component to the desired white light for a white light source. A common blue excitation source is an InGaN LED, or GaN LED, emitting with a peak at about 460 nm. Furthermore, in embodiments, an excitation source with emission wavelength within a range from 200 nm to 480 nm may be used.

Embodiments of the present invention also include white light illumination sources comprising a blue-emitting InGaN light emitting diode (LED) and any of the red-emitting phosphors described herein. It may also include a yellow-emitting phosphor and/or a green-emitting phosphor. In one embodiment a green emitting phosphor has the formula $Ce:Lu_3Al_5O_{12}$. Two exemplary red-emitting phosphors according to embodiments of the present invention are $Eu_{0.05}Ca_{0.1}Sr_{1.95}Si_{4.8}Al_{0.2}N_8$ and $Eu_{0.05}Ca_{0.1}Sr_{1.95}Si_{4.8}B_{0.2}N_8$.

Some embodiments of the invention are based on a modified version of $M_2Si_5N_8$ (a so-called "258" compound), where M is an alkaline earth. The modification to the 258 compound includes substitution of a periodic table column IIIB element B, Al, Ga, and/or In for Si, particularly Al, where charge compensation may be accomplished by the substantially interstitial insertion of a so-called modifier cation into the phosphor's host crystal structure. Modifier cations have a range of valencies, and include $Li^+$, $Ca^{2+}$, and $Y^{3+}$. Advantages of the modification to 258 include an increase in peak emission wavelength towards the deep red end of the spectrum, and an enhanced stability in elevated thermal and humidity conditions.

A phosphor may comprise a nitride-based composition represented by the chemical formula $M_{(x/v)}M'_2A_{5-y}D_yN_{8-z}E_p$:RE, wherein: M is at least one monovalent, divalent or trivalent metal with valence v; M' is at least one of Mg, Ca, Sr, Ba, and Zn; A is at least one of Si, C, and Ge; D is at least one of B, Al, and Ga; E is at least one monovalent, divalent or trivalent anion with valence w; and RE is at least one of Eu, Ce, Tb, Pr, and Mn; wherein x=y−3z+pw, wherein y satisfies $0.1 \leq y < 1.1$ and wherein the phosphor has the general crystalline structure of $M'_2A_5N_8$:RE, D substitutes for A within said general crystalline structure, E substitutes for N within said general crystalline structure, and M is located within said general crystalline structure substantially at the interstitial sites. Furthermore, the red-emitting phosphor may be selected from the group consisting of: $Eu_{0.05}Ca_{0.1}Sr_{1.95}B_{0.2}Si_{4.8}N_8$; $Eu_{0.05}Ca_{0.1}Sr_{1.95}Al_{0.2}Si_{4.8}N_8$; $Eu_{0.05}Ca_{0.1}Sr_{1.95}Ga_{0.2}Si_{4.8}N_8$; $EU_{0.05}Sr_{1.95}Al_{0.2}Si_{4.8}N_8$; $EU_{0.05}Sr_{1.95}B_{0.2}Si_{4.8}N_{7.93}$; $EU_{0.05}Sr_{1.95}Al_{0.2}Si_{4.8}N_{7.93}$; $Eu_{0.05}Sr_{1.95}Ga_{0.2}Si_{4.8}N_{7.93}$; $Eu_{0.05}Sr_{1.95}Si_5N_8$ with $Ca_3N_2$ addition; $Eu_{0.05}Sr_{1.95}Si_5N_8$ with BN addition; $Eu_{0.05}Sr_{1.95}Si_5N_8$ with AlN addition; and $Eu_{0.05}Sr_{1.95}Si_5N_8$ with GaN addition.

A red-emitting phosphor may comprise a nitride-based composition represented by the chemical formula $M'_2Si_{5-y}D_yN_{8-z}$:RE, wherein M' is at least one of Mg, Ca, Sr, Ba, and Zn; D is at least one of B, Al, and Ga; and RE is at least one of Eu, Ce, Tb, Pr, and Mn; wherein y=3z, the phosphor has the general crystalline structure of $M'_2Si_5N_8$:RE, and Al substitutes for Si within said general crystalline structure. Furthermore, the red-emitting phosphor may be configured wherein M' is Sr, D is Si, and RE is Eu. The red-emitting phosphor may be configured wherein said red-emitting phosphor consists of Sr, Si, Al, N and Eu. The red-emitting phosphor may be configured wherein y satisfies $0.1 \leq y < 0.4$. The red-emitting phosphor may be configured wherein z satisfies $0.05 \leq z < 0.09$. The red-emitting phosphor may be configured wherein the phosphor absorbs radiation at a wavelength ranging from about 200 nm to about 470 nm and emits light with a photoluminescence peak emission wavelength greater than 623 nm. The phosphor may be configured wherein the phosphor is selected from the group consisting of: $Eu_{0.05}Sr_{1.95}B_{0.2}Si_{4.8}N_{7.93}$; $Eu_{0.05}Sr_{1.95}Al_{0.2}Si_{4.8}N_{7.93}$; and $Eu_{0.05}Sr_{1.95}Ga_{0.2}Si_{4.8}N_{7.93}$.

A red-emitting phosphor with a nitride-based composition may comprise: an element M, wherein M is at least one of Li, Na, K, Sc, Ca, Mg, Sr, Ba and Y; an element M', wherein M' is at least one of Mg, Ca, Sr, Ba, and Zn; silicon; aluminum; nitrogen; and an element RE, wherein RE is at least one of Eu, Ce, Tb, Pr and Mn; wherein said red-emitting phosphor has the general crystalline structure of $M'_2Si_5N_8$:RE with M and Al incorporated therein, and wherein said red-emitting phosphor is configured such that the change in chromaticity coordinates CIE $\Delta x$ and CIE $\Delta y$ after 1,000 hours of aging at about 85° C. and about 85% relative humidity is less than or equal to about 0.03 for each coordinate.

A red-emitting phosphor may comprise a nitride-based composition represented by the chemical formula $M_{(x/v)}M'_2Si_{5-x}Al_xN_8$:RE, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies $0.1 \leq x < 0.4$, and wherein said red-emitting phosphor has the general crystalline structure of $M'_2Si_5N_8$:RE, Al substitutes for Si within said general crystalline structure, and M is located within said general crystalline structure substantially at the interstitial sites.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIG. 17A is the change in photoluminescent intensity (brightness) with time, FIG. 17B is the change in CIE x chromaticity coordinate with time, and FIG. 17C is the change in CIE y chromaticity coordinate with time, according to some embodiments of the present invention;

18A is the change in photoluminescent intensity (brightness) with time, FIG. 18B is the change in CIE x chromaticity coordinate with time, and FIG. 18C is the change in CIE y chromaticity coordinate with time, according to some embodiments of the present invention;

DETAILED DESCRIPTION OF THE INVENTION

Figure 1:
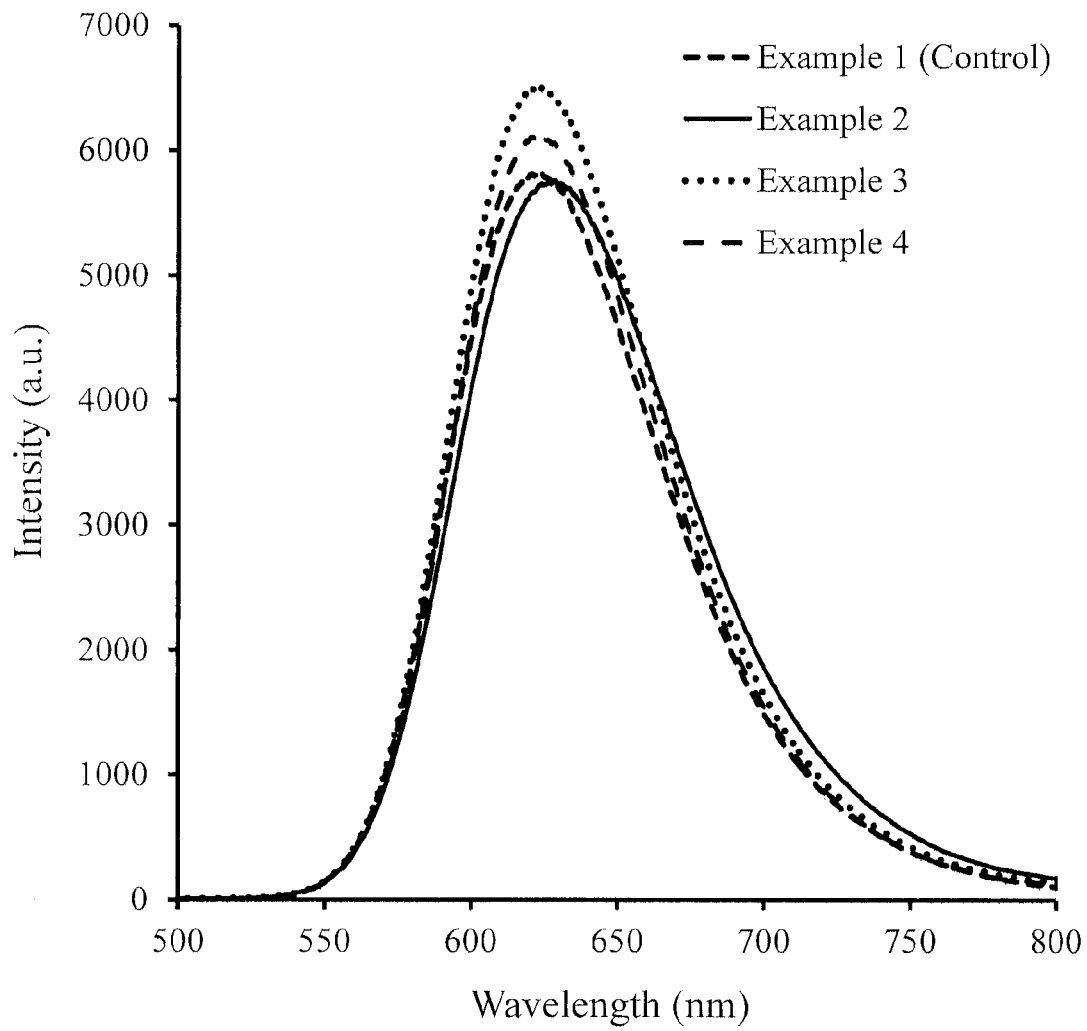
FIG. 1 shows emission spectra of the phosphors from Samples 1 through 4, according to some embodiments of the present invention.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Some embodiments of the present invention are directed to a nitride-based phosphor composition represented by the general formula $M'_xM''_2A_{5-y}D_yE_8$:RE. Here, M' is at least one of a 1+ cation, a 2+ cation, and a 3+ cation, and M" is at least one of Mg, Ca, Sr, Ba, and Zn, used either individually or in combinations. A is at least one of C, Si and Ge, used either individually or in combinations. The element D replaces the A component substitutionally, where D is selected from the group consisting of column IIIB elements of the periodic table of elements. The labeling of the columns of the periodic table in this disclosure are those used in the inside front cover of the book "Optical Properties of Solids," by Mark Fox (Oxford University Press, New York, 2001) which follow the old IUPAC (International Union of Pure and Applied Chemistry) system. See http://en.wikipedia.org/wiki/Group_(periodic_table), last viewed Jan. 15, 2013. In one embodiment, D is at least one of B, Al, and Ga, used either individually or in combinations.

The modifier cation M' is added to the phosphor to charge compensate for the substitution of D for A. Specifically, M' is at least one of $Li^{1+}$, $Na^{1+}$, $K^{1+}$, $Sc^{3+}$, $Ca^{2+}$, and $Y^{3+}$, used either individually or in combinations. M' is an extra cation, utilized in addition to the stoichiometric amount "2" of the divalent metal M in the formula $M_2Si_5N_8$, and as such, this modifier cation is said to have been inserted into the phosphor substantially interstitially. More will be said about the nature of this site in a nomenclature section to follow.

E in the general formula of the present phosphor is at least one of a 3− anion, a 2− anion, and a 1− anion. Specifically, E may be at least one of $O^{2-}$, $N^{3-}$, $F^{1-}$, $Cl^{1-}$, $Br^-$, and $I^-$, used either individually or in combinations. The rare earth RE is at least one of Eu, Ce, Tb, Pr, and Mn; and y is given by $0.01 \leq y \leq 1.0$. The value of the parameter y may simultaneously be defined as the value of x times the valence of M'; this is the condition that achieves the charge balance.

As just discussed, the M' cation is a "modifier" cation, a term of art used to denote cations introduced substantially interstitially to achieve charge balance and/or stabilization of the crystal structure, rather than by a substitutional mechanism. Interstitial sites are cavities, holes, or channels that exist in the crystalline lattice by virtue of the manner in which the host's constituent atoms are arranged (packed, or stacked). Dopant atoms that occupy the interstices of a crystal are to be distinguished from such atoms introduced substitutionally; in this latter mechanism, the dopant atoms replace host atoms residing on crystal lattice sites. The difference in the ways that these two mechanisms achieve charge balance in the phosphor will be manifested by the host's stoichiometric formula.

In the following disclosure, a discussion of known $(Sr_{1-x}Ca_x)_2Si_5N_8:Eu^{2+}$ compositions will be provided, followed by some brief comments about the nature of the interstitial site of the present embodiments. Next the disclosure will present phosphors based on the present $M'_xM''_2A_{5-y}D_yE_8$:RE embodiments, giving their advantages and properties, and how these phosphors differ from the prior art. Specific examples will be given, including a phosphor wherein the column IIIB element substituting for $Si^{4+}$ was $Al^{3+}$, and wherein the modifying cation was $Ca^{2+}$. Finally, the red-emitting nitride phosphors of the present invention being utilized to form a white LED will be discussed, along with accelerated aging results that show the thermal and chemical stability of the phosphors of the present invention.

Discussion of Known $(Sr_{1-x}Ca_x)_2Si_5N_8:Eu^{2+}$ Compositions

Compositions based on $(Sr_{1-x}Ca_x)_2Si_5N_8:Eu^{2+}$ have been discussed by Piao et al., in an article titled "Preparation of $(Sr_{1-x}Ca_x)_2Si_5N_8:Eu^{2+}$ solid solutions and their luminescence properties," *J. of the Electrochem. Soc.* 153 (12) H232-H235 (2006) (the "Preparation Paper"). As taught by Piao et al. in the Preparation Paper, "... the solution of $Ca^{2+}$ in $(Sr_{1-x}Ca_x)_2Si_5N_8:Eu^{2+}$ is limited to the composition of x=0.5. The first [$Ca_2Si_5N_8$] phase appears at the composition of x=0.6 in $(Sr_{1-x}Ca_x)_2Si_5N_8:Eu^{2+}$. Two phases coexist in the range of 0.5<x<0.75 where transformation from orthorhombic to monoclinic structure occurs." Piao et al. shed some light on where the $Ca^{2+}$ modifier cation is located in red nitride phosphors: "The doped $Eu^{2+}$ ions, which take the position of $Sr^{2+}/Ca^{2+}$ ions, are arranged in the channels formed by $Si_6N_6$ rings along [100] and [010] orientation for two phases, respectively." When the $Ca^{2+}$ content is increased to x=0.5 in a [$Sr_2Si_5N_8$] phase, forming $SrCaSi_5N_8$, "the grains are better crystallized, and the size [of the grains are] increased." This would lead to enhanced optical properties. As x is increased to 0.6 (60 atomic percent), "the SEM image indicates that there are two phases with different morphology." See Piao et al., Preparation Paper at page H233.

The nature of the modifier cation interstitial sites in the present red nitride phosphors is elucidated to some degree in the paper by Piao et al. There are two crystallographic M sites per unit cell in $M_2Si_5N_8$ (where M=Sr and Ca); this is why there are two emission bands in such compounds. In the $(Sr_{1-x}Ca_x)_2Si_5N_8$:$Eu^{2+}$ series, however, only one broadband emission is seen. This suggests that either the two sites have very similar crystal environments, or that the $Eu^{2+}$ ions in the $N^{3-}$-rich networks are not particularly sensitive to the fact that the two sites have different coordination (number of $N^{3-}$ anions surrounding, and associated with each M site). See Piao et al., the Preparation Paper at page H234.

Piao et at teach that as $Ca^{2+}$ is added to substitute for Sr in the $[Sr_2Si_5N_8]$ phase the emission shifts to longer wavelengths up to the point where x=0.5 in $(Sr_{1-x}Ca_x)_2Si_5N_8$:$Eu^{2+}$ series (with 2 atomic % Eu). The $Eu^{2+}$ emission band redshifts from 617 nm for $Sr_2Si_5N_8$:$Eu^{2+}$ to 632 nm for $SrCaSi_5N_8$:$Eu^{2+}$, where the Eu concentration is 2 atomic % in both cases. The ionic radius of $Ca^{2+}$ and $Sr^{2+}$ ions are 1.23 and 1.36 Å, respectively, for a coordination number of 10 in both cases. Thus, with the substitution of $Ca^{2+}$ ions in the $Sr^{2+}$ site of the $[Sr_2Si_5N_8]$ phase, M—N bond lengths and lattice parameters will be seen to decrease in x-ray diffraction (XRD) experiments. The shorter average distance of the Ca—N bond relative to Sr—N causes the $Eu^{2+}$ ion to experience a stronger crystal field strength, which is inversely proportional to the chemical bond length to the $5^{th}$ power. See Piao et al., the Preparation Paper at page H234.

According to Piao et al., the emission intensity decreases with increasing $Ca^{2+}$ content in $(Sr_{1-x}Ca_x)_2Si_5N_8$:$Eu^{2+}$ phosphors. This is explained by Piao et al. at page H235; while the details are too complex to address here, the intensity decrease has to do with how the $Eu^{2+}$ ion is coordinated, and the energy level diagram associated with excited state transitions. See Piao et al., the Preparation Paper at page H235.

The Nature of the Interstitial Site of the Present Embodiments

While not wishing to be bound by any particular theory regarding the nature of the modifying-cation interstitial-sites of the present embodiments, it is helpful to discuss what is known, or may be deduced about them. This is predominantly a matter of nomenclature, as the term "interstitial site" is used in this disclosure to describe the sites where the charge-balancing modifier-cations are inserted. (The reader will recall that modifier-cations, such as $Ca^{2+}$, can be used to charge-balance the charge imbalance created by an $Al^{3+}$ for $Si^{4+}$ substitution). The term "interstitial" was chosen to emphasize the fact that the modifier cations generally do not replace, or substitute for, existing ions on crystalline lattice sites. As emphasized previously, modifier cations are cations that are added to the existing crystalline host structure.

That said, there does not appear to be a plethora of information in the literature about the nature of these interstitial sites, including where they are located, or how many of them there are, in the modified-$M_2Si_5N_8$:$Eu^{2+}$ unit cell. There may be some data to indicate that they are unoccupied M sites. As taught by Xie et al. in an article titled "A simple, efficient synthetic route to $Sr_2Si_5N_8Eu^{2+}$-based red phosphors for white light-emitting diodes," Chem. Mater. 2006, 18, 5578-5583, the site occupancy fraction in at least one experiment synthesizing $Sr_2Si_5N_8$ was 90.7 percent for the Sr1 site, and 88.9 percent for the Sr2 site, remembering that there are two M sites per unit cell. Xie et al. describe this as a "slight deficiency of Sr at both sites." In materials science theory the vacancy density of a pure crystalline material should be on the order of a hundred parts per million of the existing lattice sites depending on the thermal equilibrium conditions of the crystal produced. As such, a small percentage of the charge balance ions may actually end up in vacant metal ion sites, such as Sr/Ca/Eu lattice sites—the charge balance ions filling the vacancies before the interstitial sites.

Discussion of the Present Phosphors Based on $M'_xM''_2A_{5-y}D_yE_8$:RE

Embodiments of the present invention are directed to a nitride-based phosphor composition represented by the general formula $M'_xM''_2A_{5-y}D_yE_8$:RE. Here, M' is at least one of a 1+ cation, a 2+ cation, and a 3+ cation, and M" is at least one of Mg, Ca, Sr, Ba, and Zn. A is at least one of Si and Ge. The element D replaces the A component substitutionally, where D is elected from the group consisting of column IIIB elements of the periodic table. In one embodiment, D is at least one of B, Al, and Ga.

To charge compensate for the substitution of D for A, a modifier cation M' is added to the phosphor. M' is at least one of $Li^{1+}$, $Na^{1+}$, $K^{1+}$, $Sc^{3+}$, $Ca^{2+}$, and $Y^{3+}$, and this modifier cation is inserted into the phosphor substantially interstitially, E is at least one of a 3− anion, a 2− anion, and a 1− anion, and may be at least one of $O^{2-}$, $N^{3-}$, $F^-$, $Cl^-$, $Br^-$, and $I^-$. The rare earth RE is at least one of Eu, Ce, Tb, Pr, and Mn; and y is given by $0.01 \leq y < 1.0$, and x times the valence of M' is equal to y.

In alternative embodiments, the modifier cations M' residing in the crystal substantially interstitially are selected from the group consisting of the alkaline earths, including $Ca^{2+}$, and the elements $Li^+$, $Zn^{2+}$, $Y^{3+}$, and one or more rare earths (RE), each of these interstitially placed modifier cations used either individually or in combinations.

Substitutional mechanisms discussed above occur when a rare earth activator ion is inserted into the host replacing an alkaline earth atom at its lattice site, thereby converting an "ordinary ceramic" into a phosphor. But there are other ways in which a substitutional event may occur: substitution may also come into play, for example, when the Si at the center of a $SiN_4$ tetrahedron is replaced by Al. This may be done to modify optical properties. One skilled in the art will note, however, a consequence of the Al/Si substitution that is not present with the Eu/alkaline earth substitution: whereas in the latter case the substitution is charge neutral because a divalent alkaline earth cation is being replaced by a divalent rare earth cation, the substitution of $Si^{4+}$ by $Al^{3+}$ leaves the host with a missing positive charge. This missing positive charge may be balanced by a further modification of the phosphor material. In an alternative mechanism the doping of a rare earth activator can also be located on interstitial sites; for example, Eu is known to reside on the interstitial sites of a β-SiAlON phosphor.

The literature has reported two ways that are commonly used to charge balance the missing positive charge. In one scheme, an $Al^{3+}$ for $Si^{4+}$ substitution is accompanied by an $O^{2-}$ for $N^{3-}$ substitution, such that the missing positive charge is counter balanced with a missing negative charge. This leads to a network of tetrahedra that may variously have either $Al^{3+}$ or $Si^{4+}$ cations at their centers, as well as a combination of $O^{2-}$ for $N^{3-}$ anions at their corners. Since it is not know precisely which tetrahedral have which substitutions, the nomenclature used to describe this situation is $(Al,Si)$—$(N,O)_4$. Clearly, for charge balance there is one O for N substitution for each Al for Si replacement. The present embodiments do not, however, utilize $O^{2-}$ for $N^{3-}$ substitution as a primary means of charge balance, preferring instead to provide substantially interstitial modifier cations, but this is not to say that the $O^{2-}$ for $N^{3-}$ substitution may not be used in conjunction with modifier cations.

A second way to charge balance the missing positive charge, and the primary method utilized by the present inventors in this disclosure, is to supply additional positive charges substantially interstitially to the crystal. A series of experiments was conducted by the present inventors wherein column IIIB elements were substituted for Si, $Ca^{2+}$ and/or $Sr^{2+}$ was employed as a modifier cation.

A generalized representation of a phosphor according to some embodiments of the present invention which includes substitution for N in combination with additional cations to achieve charge balance for a Group IIIB element substitution for the Si, or equivalent element, may comprise a nitride-based composition represented by the chemical formula $M_{(x/v)}M'_2A_{5-y}D_yN_{8-z}E_p$:RE, wherein: M is at least one monovalent, divalent or trivalent metal with valence v; M' is at least one of Mg, Ca, Sr, Ba, and Zn; A is at least one of Si, C, and Ge; D is at least one of B, Al, and Ga; E is at least one monovalent, divalent or trivalent anion with valence w; and RE is at least one of Eu, Ce, Tb, Pr, and Mn; wherein x=y−3z+pw, wherein y satisfies 0.1≤y<1.1 and wherein the phosphor has the general crystalline structure of $M'_2A_5N_8$:RE, D substitutes for A within said general crystalline structure, E substitutes for N within said general crystalline structure, and M is located within said general crystalline structure substantially at the interstitial sites.

In a first series of experiments, denoted as Samples 1-4, elements from column IIIB of the periodic table were evaluated as potential substitutes for Si. The starting materials used to synthesis the "base compound," that is to say, the phosphor without a column IIIB content, were powders of $EuCl_3$, $Sr_3N_2$, $Ca_3N_2$, and $Si_3N_4$ as the sources of europium, strontium, calcium, silicon, respectively. Any of the nitride salts, of course, had the potential to provide nitrogen. The three elements from column III of the periodic table used to substitute for Si were Al, B, and Ga. Experimental details for this series of compounds are provided in Tables 2A-2B. The stoichiometric compositions of the compounds from Samples 1-4 that include column IIIB elements substituting for silicon are, in the increasing order of atomic weight B, Al, and Ga: $Eu_{0.05}Ca_{0.1}Sr_{1.95}B_{0.2}Si_{4.8}N_8$ for the boron containing compound; $Eu_{0.05}Ca_{0.1}Sr_{1.95}Al_{0.2}S_{4.8}N_8$ for the Al containing compound, and $Eu_{0.05}Ca_{0.1}Sr_{1.95}Ga_{0.2}Si_{4.8}N_8$ for the Ga containing compound.

Referring to FIG. 1, the phosphor of this series from Samples 1-4 with the highest photoluminescent intensity was the boron containing compound; this sample also demonstrated the phosphor with the shortest emission peak wavelength (emitting at about 623 nm). The aluminum containing phosphor of this group displayed the lowest photoluminescent intensity, including that of the control for this group of compound, the 2-5-8 phosphor containing no column IIIB substituent ($Eu_{0.05}Sr_{1.95}Si_5N_8$). In other words, even the control compound $Eu_{0.05}Sr_{1.95}Si_5N_8$ displayed a higher photoluminescent intensity than did the aluminum containing compound. In a separate experiment the photoluminescent intensity of aluminum containing samples can be further increased by sintering at a higher temperature. It was also noticed that the samples containing B and Ga did not show a substantial 2θ degrees shift in the XRD data which may indicate that the substitution of Si might not have occurred in these samples. For example, the B may have evaporated or may have formed an impurity phase with other elements such as Sr, and the 2-5-8 material (with little or no substitution of B for Si) is still the majority phase.

In a second series of experiments, denoted as Samples 5-8, elements from column IIIB of the periodic table were evaluated as potential substitutes for Si, but in this second set, no calcium was present. Instead, to effect charge balance, oxygen was substituted for nitrogen. The oxygen was supplied in the form of the raw material powders $SiO_2$ and $Al_2O_3$. Of course, in these instances, the raw powders $SiO_2$ and $Al_2O_3$ also acted as sources, or potential sources, of silicon and aluminum, as well as a source of oxygen. Experimental details for this series of compounds that used oxygen for charge balance are provided in Tables 3A-3B. The stoichiometric compositions of the compounds from Samples 5-8 that charge balance B, Al, and/or Ga for Si substitutions via the substitution of oxygen for nitrogen are, in that order: $Eu_{0.05}Sr_{1.95}B_{0.2}Si_{4.8}O_{0.2}N_{7.8}$ for the boron containing compound; $Eu_{0.05}Sr_{1.95}Al_{0.2}Si_{4.8}O_{0.2}N_{7.8}$ for the Al containing compound, and $Eu_{0.05}Sr_{1.95}Ga_{0.2}Si_{4.8}O_{0.2}N_{7.8}$ for the Ga containing compound.

Figure 5:
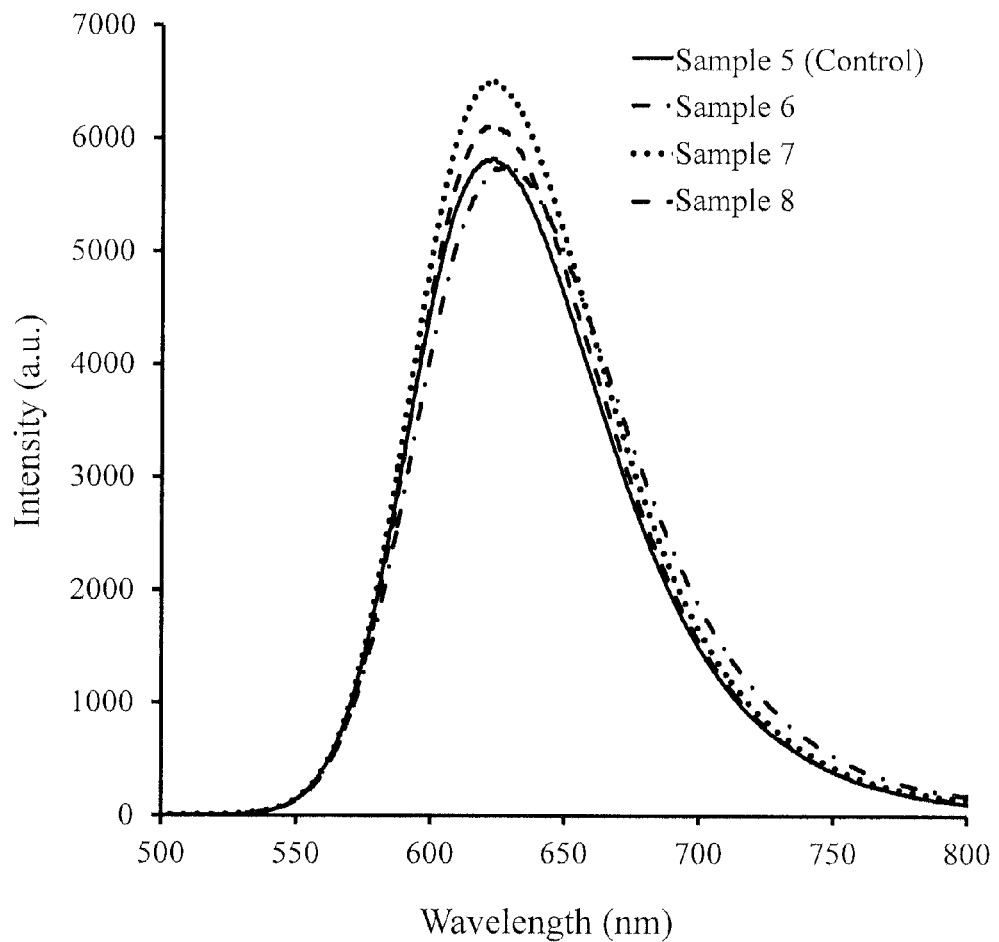
FIG. 5 shows emission spectra from the phosphors of Samples 5-8, according to some embodiments of the present invention.

Referring to FIG. 5, the phosphor of this series (Samples 5-8) with the highest photoluminescent intensity was the control compound, $Eu_{0.05}Sr_{1.95}Si_5N_8$. This might appear to indicate that, at least for this series of experiments the addition of oxygen decreases photoluminescent intensity.

In a third series of experiments, denoted as Samples 9-12, a comparison was made between compounds charge balanced by interstitial Ca, versus substitutional oxygen, both charge balances necessitated by a substitution of Al for Si. These compounds were further compared to a phosphor having Al, but no intentional charge balance mechanism being invoked. Experimental details for this series of compounds are provided in Tables 4A-4B. The stoichiometric compositions of the compounds from Samples 9-12 were: $Eu_{0.05}Ca_{0.1}Sr_{1.95}Al_{0.2}Si_{4.8}N_8$, a compound where the column IIIB element Al has been substituted for Si, and charge balance is effected by interstitial Ca, $Eu_{0.05}Sr_{1.95}Al_{0.2}Si_{4.8}O_{0.2}N_{7.8}$, a compound where the column IIIB element Al has again been substituted for Si, but this time charge balance is effected by oxygen substituting for nitrogen, $Eu_{0.05}Sr_{1.95}Al_{0.2}Si_{4.8}N_{7.93}$, a compound where a nitrogen deficit is used for charge balance for the substitution of Si by Al, and finally the control, $Eu_{0.05}Sr_{1.95}Si_5N_8$.

Figure 7:
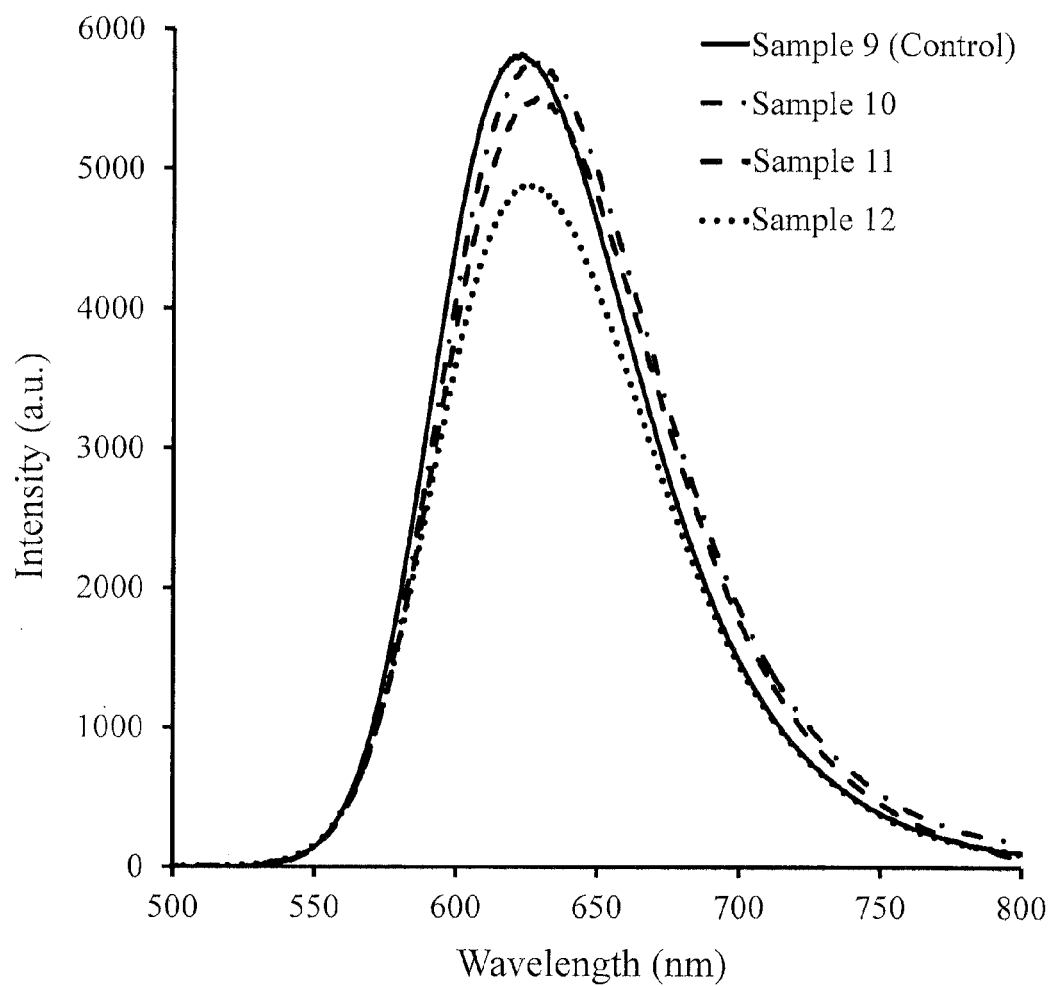
FIG. 7 shows emission spectra of the phosphors from Samples 9-12, according to some embodiments of the present invention.

Referring to FIG. 7, the phosphor of this series (Samples 9-12) with the highest photoluminescent intensity was again the control compound, $Eu_{0.05}Sr_{1.95}Si_5N_8$, although the Al substituted compound using interstitial Ca for charge balance displayed a photoluminescent intensity that was almost as high. The data further shows that the substitution and subsequent charge balance of this compound shifted the peak emission intensity towards longer wavelengths. This is opposite to the wavelength shift that is seen when Ca is substituted for Sr in a "conventional" $Sr_2Si_5N_8$ compound. This latter observation has many advantages with regard to color rendition when producing white light illumination from a white LED. From the experiments conducted by the present inventors, it may be concluded that a substantially interstitial charge balance accomplished by Ca in light of an Al substitution of Si is necessary.

In a fourth series of experiments, denoted as Samples 13-16, elements from column IIIB of the periodic table were evaluated as potential substitutes for Si, but in this series, no intentional charge balance was effected. This latter statement means that an interstitial cation such as Ca, was not added; nor was oxygen substituted for nitrogen (thus the formulas show a stoichiometric content of 8 for the nitrogen). Experimental details for this series of compounds are provided in Tables 5A-5B. In this series of experiments the inventors believe that some nitrogen sites could be vacant to balance the charge. Based on this assumption of nitrogen deficiency for charge balance the stoichiometric compositions of the compounds from Samples 13-16 are expected to be: $Eu_{0.05}Sr_{1.95}B_{0.2}Si_{4.8}N_{7.93}$, a compound where the column IIIB element B has been substituted for Si, with no further attempt at charge balance; $Eu_{0.05}Sr_{1.95}Al_{0.2}Si_{4.8}N_{7.93}$, a compound where the column IIIB element Al has again been substituted for Si, with again no further attempt to charge balance; and $Eu_{0.05}Sr_{1.95}Ga_{0.2}Si_{4.8}N_{7.93}$, a compound where the column IIIB element Ga has been substituted for Si, and again, with no further attempt at charge balance. The control for this series was again $Eu_{0.05}Sr_{1.95}Si_5N_8$.

A generalized representation of a red-emitting phosphor according to some embodiments of the present invention which includes a N deficit to achieve charge balance for a Group IIIB element substitution for the Si, or equivalent element, may comprise a nitride-based composition represented by the chemical formula $M'_2Si_{5-y}D_yN_{8-z}$:RE, wherein M' is at least one of Mg, Ca, Sr, Ba, and Zn; D is at least one of B, Al, and Ga; and RE is at least one of Eu, Ce, Tb, Pr, and Mn; wherein y=3z, the phosphor has the general crystalline structure of $M'_2Si_5N_8$:RE, and Al substitutes for Si within said general crystalline structure. Furthermore, the red-emitting phosphor may be configured wherein M' is Sr, D is Si, and RE is Eu. The red-emitting phosphor may be configured wherein said red-emitting phosphor consists of Sr, Si, Al, N and Eu. The red-emitting phosphor may be configured wherein y satisfies $0.1 \leq y < 0.4$. The red-emitting phosphor may be configured wherein z satisfies $0.05 \leq z < 0.09$.

Figure 9:
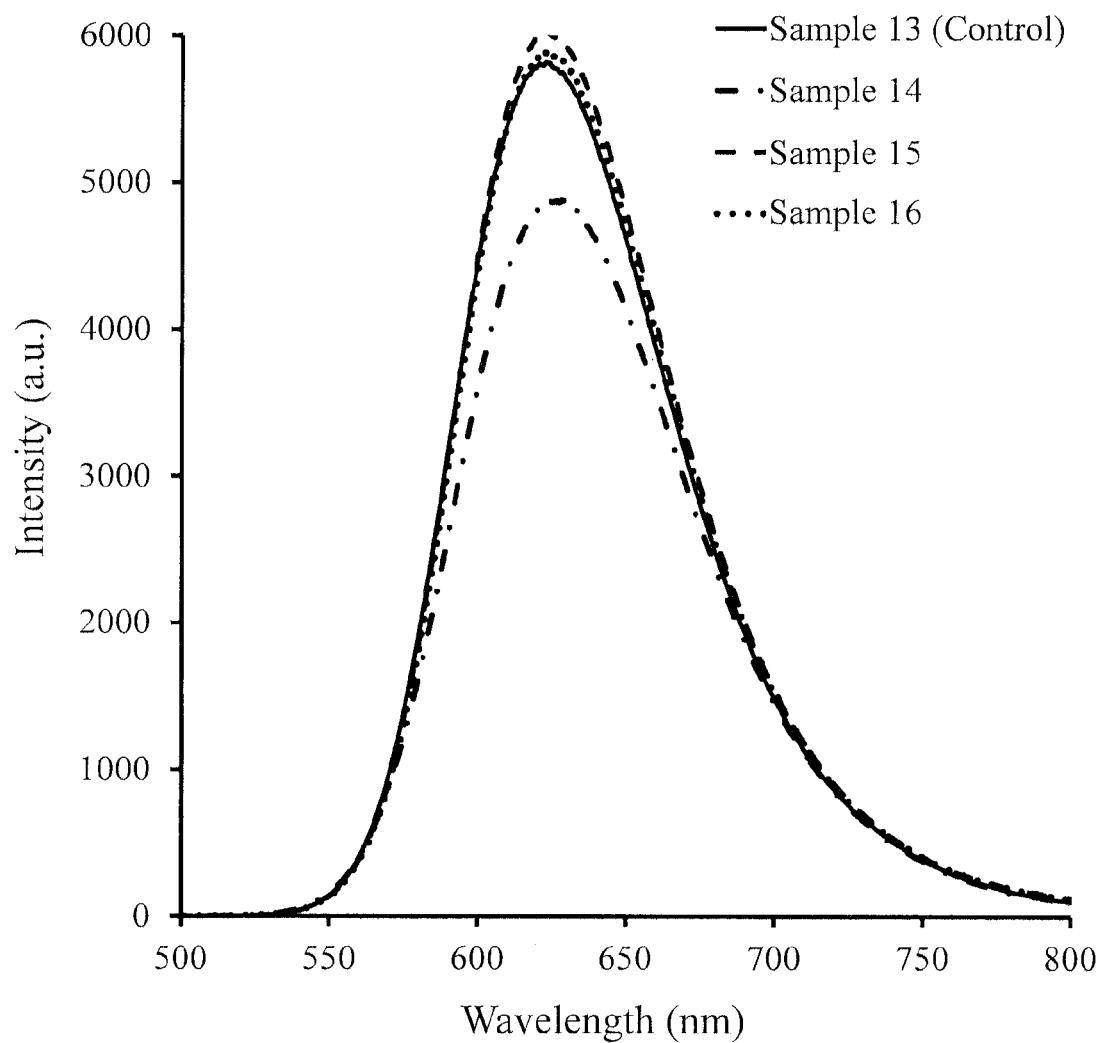
FIG. 9 shows emission spectra of the phosphors from Samples 13 through 16, according to some embodiments of the present invention.

Referring to FIG. 9, the phosphor of this series (Samples 13-16) with the highest photoluminescent intensity was the boron containing compound. Next in intensity were two compounds with substantially the same intensity: the gallium containing compound, and the control. The aluminum containing compound had significantly lower photoluminescent intensity. It is interesting to note that in this series, the peak emission wavelength exhibited by the control, the B containing and Ga containing samples (Samples 15 & 16), is at about 624 nm. It is possible, according to some embodiments, that B and Ga may not substitute for Si, instead serving as a flux. This statement is made in light of experiments wherein the x-ray diffraction peak(s) did not shift as a result of the substitution; furthermore, the peak emission wavelength did not shift either in these experiments. It is interesting to note that this N deficit charge balanced Al substituted sample has less of a wavelength shift and a lower photoluminescence intensity compared with the Ca charge balanced sample (Sample 2). This might indicate that a Ca placed interstitially for charge balance shifts the wavelength further and improves the photoluminescence intensity.

In a fifth series of experiments, denoted as Samples 17-21, elements from column IIIB of the periodic table were evaluated as elements in addition to the stoichiometric $Sr_2Si_5N_8$ formula. The amounts of the column IIIB elements added to the raw powder mix were roughly twice that used in Samples 13-16 (i.e. 50% less than those IIIB substitution of silicon samples). The Sample 21 has Ca added in the same amount as the IIIB added samples. Since the compositions of sintered compounds can be difficult to determine accurately, especially if single crystal x-ray diffraction is not the method used, the stoichiometric formulas for this series are shown by representing the Ca, B, Al, and Ga cations as "additives" of their respective raw powder salts. Thus the stoichiometric formulas of the compounds from Samples 17-21 may be represented as: $Eu_{0.05}Sr_{1.95}Si_5N_8$ with $Ca_3N_2$ addition; $Eu_{0.05}Sr_{1.95}Si_5N_8$ with BN addition; $Eu_{0.05}Sr_{1.95}Si_5N_8$ with AlN addition; $Eu_{0.05}Sr_{1.95}Si_5N_8$ with GaN addition; and the control, $Eu_{0.05}Sr_{1.95}Si_5N_8$. Experimental details for this series of compounds are provided in Tables 6A-6B.

Figure 11:
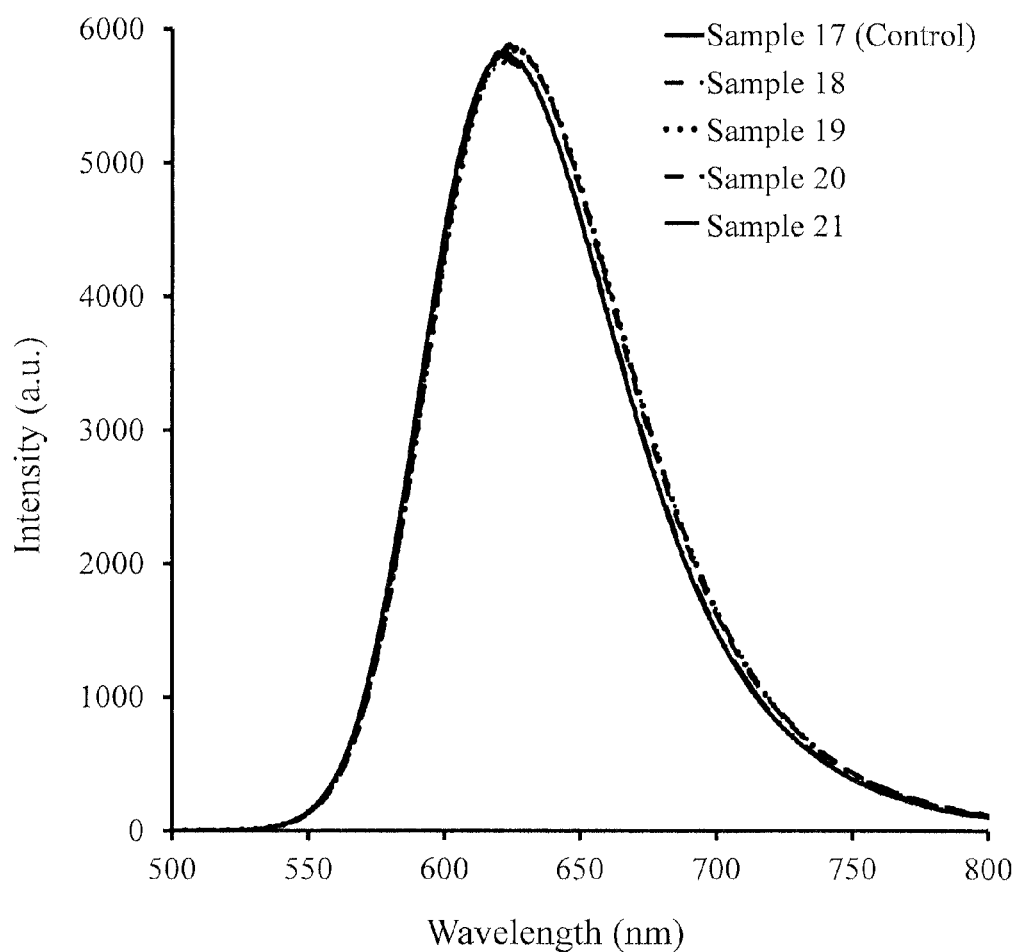
FIG. 11 shows emission spectra of the phosphors from Samples 17 through 21, according to some embodiments of the present invention.

Referring to FIG. 11, each of the phosphors of this series (Samples 17-21) displayed substantially the same photoluminescent intensity, as well as a substantially similar peak emission wavelength, at about 624 nm, which indicates that the simple additions of column IIIB elements might not substitute for silicon.

Figure 13:
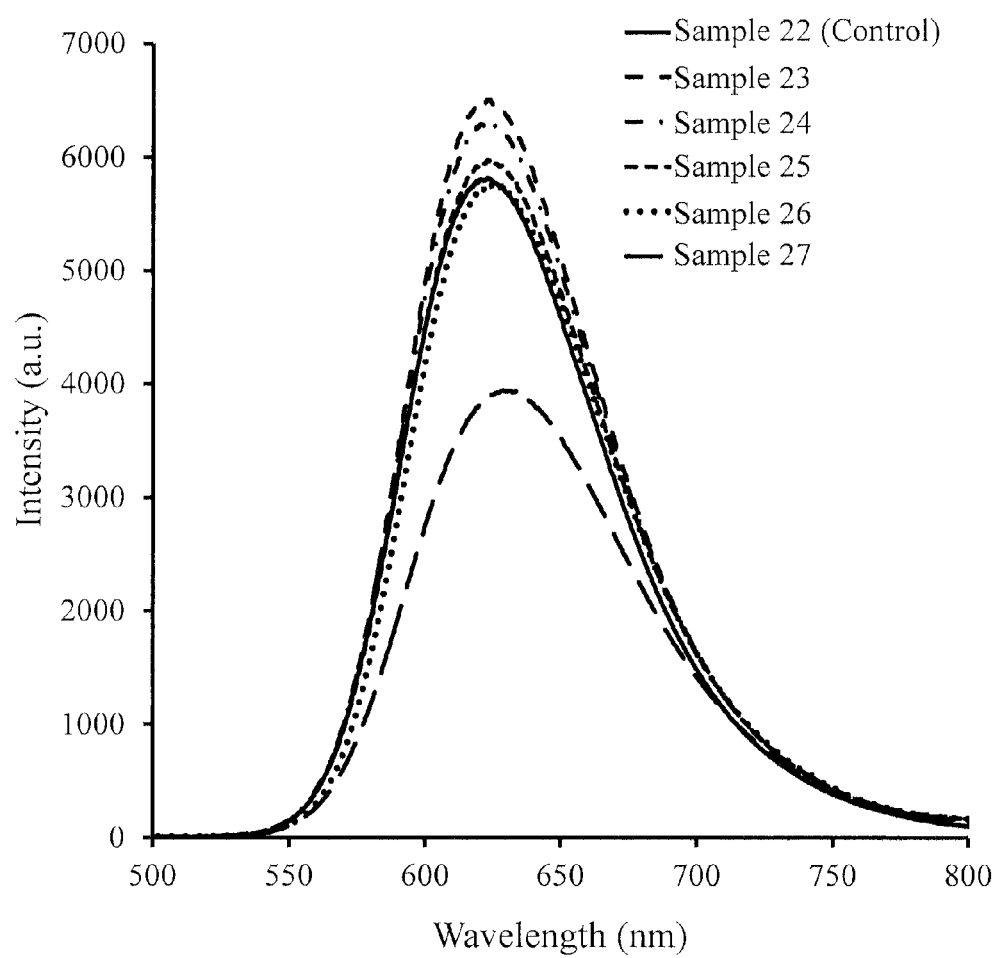
FIG. 13 shows emission spectra of the phosphors from Samples 22 through 27, according to some embodiments of the present invention.

In a sixth series of experiments, denoted as Samples 22-27, boron was selected from column IIIB of the periodic table for further investigation. See, for example, FIG. 1, and the boron containing sample in that set of Samples 1-4. In this set of experiments, the boron content was represented stoichiometrically by the parameter "y", which had the values y=0; y=0.2; y=0.3; y=0.4; y=0.5; and y=1.0. Charge compensation was accomplished by interstitial calcium addition, in respectively increasing amounts. Experimental details for this series of compounds are provided in Tables 7A-7B. The emission spectra of the phosphors from Samples 22-27 are shown in FIG. 13.

Figure 20:
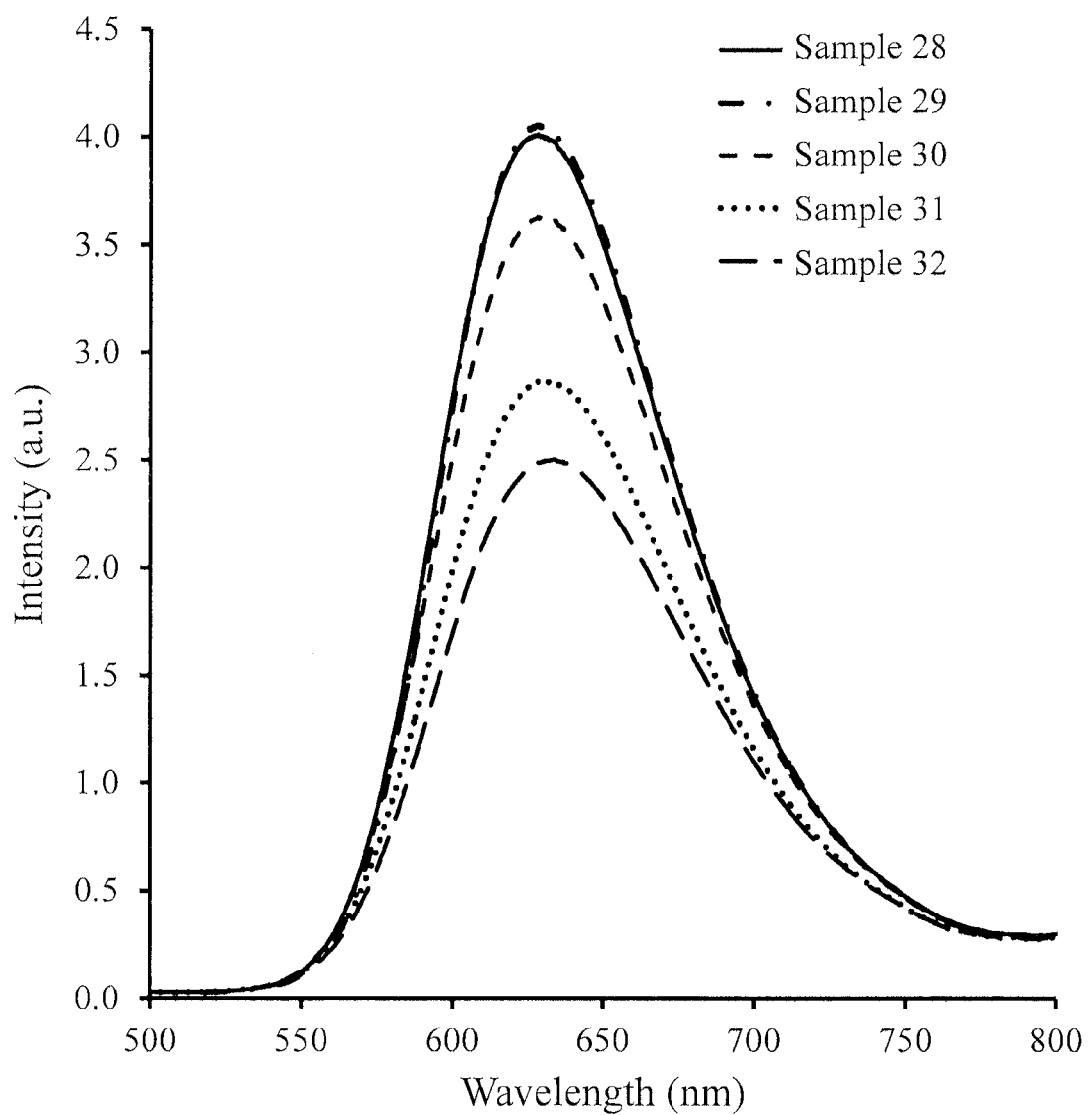
FIG. 20 shows emission spectra of the phosphors from Samples 28 through 32, according to some embodiments of the present invention.

In a seventh series of experiments, denoted as Samples 28-32, aluminum was selected from column IIIB of the periodic table for further investigation. See, for example, FIG. 1, and the aluminum containing sample in that set of Samples 1-4. In this set of experiments, the boron content was represented stoichiometrically by the parameter "y", which had the values y=0.15; y=0.2; y=0.25; y=0.3; and y=0.4. Charge compensation was accomplished by interstitial calcium addition, in respectively increasing amounts. Experimental details for this series of compounds are provided in Tables 8A-8B. The emission spectra of the phosphors from Samples 28-32 are shown in FIG. 20.

Summary of Experimental Concepts

The results of the experiments described above indicate that for these experiments (possibly indicating a general trend), that the largest shift to longer emission wavelengths, accompanying the least decrease in photoluminescent intensity, was found for the combination of the column IIIB element Al substituting for Si, with Ca as the modifying cation. The amounts of the starting materials used, the peak wavelength emission, the stoichiometries of the phosphors, and a summary of what was substituted/added, is shown in the following Table 1.

TABLE 1

| | | |
|---|---|---|
| Sample 1 (control) $Eu_{0.05}Sr_{1.95}Si_5N_8$ Peak emission wavelength = 623 nm | Sample 2 (Al + interstitial Ca) $Eu_{0.05}Ca_{0.1}Sr_{1.95}Al_{0.2}Si_{4.8}N_8$ Peak emission wavelength = 629 nm. The photoluminescent intensity was similar to the control. | Starting amounts 1.64 AlN and 0.987 $Ca_3N_2$ in Sample 2 increases peak emission wavelength by 6 nm vs. the control. Sample 2 has interstitial $Ca^{2+}$ to charge balance the $Al^{3+}$ substitution of $Si^{4+}$. |
| Sample 5 (control) $Eu_{0.05}Sr_{1.95}Si_5N_8$ Peak emission wavelength = 623 nm | Sample 6 (Al + probable oxygen) $Eu_{0.05}Sr_{1.95}Al_{0.2}Si_{4.8}N_{7.8}O_{0.2}$ Peak emission wavelength = 629 nm. The photoluminescent intensity was similar to the control | Starting amounts 0.547 AlN and 1.36 $Al_2O_3$ in Sample 6 increases peak emission wavelength by 6 nm vs. the control Sample 6 has $O^{2-}$ substitution of $N^{3-}$ to charge balance the $Al^{3+}$ substitution of $Si^{4+}$. |

In the first experiment highlighted in Table 1, a substitution of $Si^{4+}$ by $Al^{3+}$ caused a charge imbalance. The phosphor of Sample 2 addressed the charge imbalance by adding a $Ca^{2+}$ modifier cation, substantially interstitially; this led to a 6 nm increase in the peak emission wavelength of the Sample 2 phosphor relative to the control, which had no Al or modifier cation. The Sample 2 phosphor had the formula $Eu_{0.05}Ca_{0.1}Sr_{1.95}Al_{0.2}Si_{4.8}N_8$, whereas the control was $Eu_{0.05}Sr_{1.95}Si_5N_8$.

In the second experiment highlighted in Table 1, a substitution of $Si^{4+}$ by $Al^{3+}$ again caused a charge imbalance. In this experiment, however, a greater amount of Al was used, and some of it was in the form of $Al_2O_3$ (a source of oxygen). Here, an $O^{2-}$ substitution for $N^{3-}$ was the charge balancing mechanism, and thus no extra or added calcium was present. The result was again a 6 nm increase in the peak emission wavelength of the Sample 6 phosphor relative to the Sample 5 control. The formula of the Sample 6 compound was $Eu_{0.05}Sr_{1.95}Al_{0.2}Si_{4.8}N_{7.8}O_{0.2}$, and again the control was $Eu_{0.05}Sr_{1.95}Si_5N_8$.

However, as discussed below, reliability test data shows that the phosphors according to the present invention which have charge balancing with calcium provide or closely approach the level of stability to humidity and temperature required by the lighting industry, whereas the phosphors which have charge balancing with oxygen have relatively poor stability.

Figure 19:
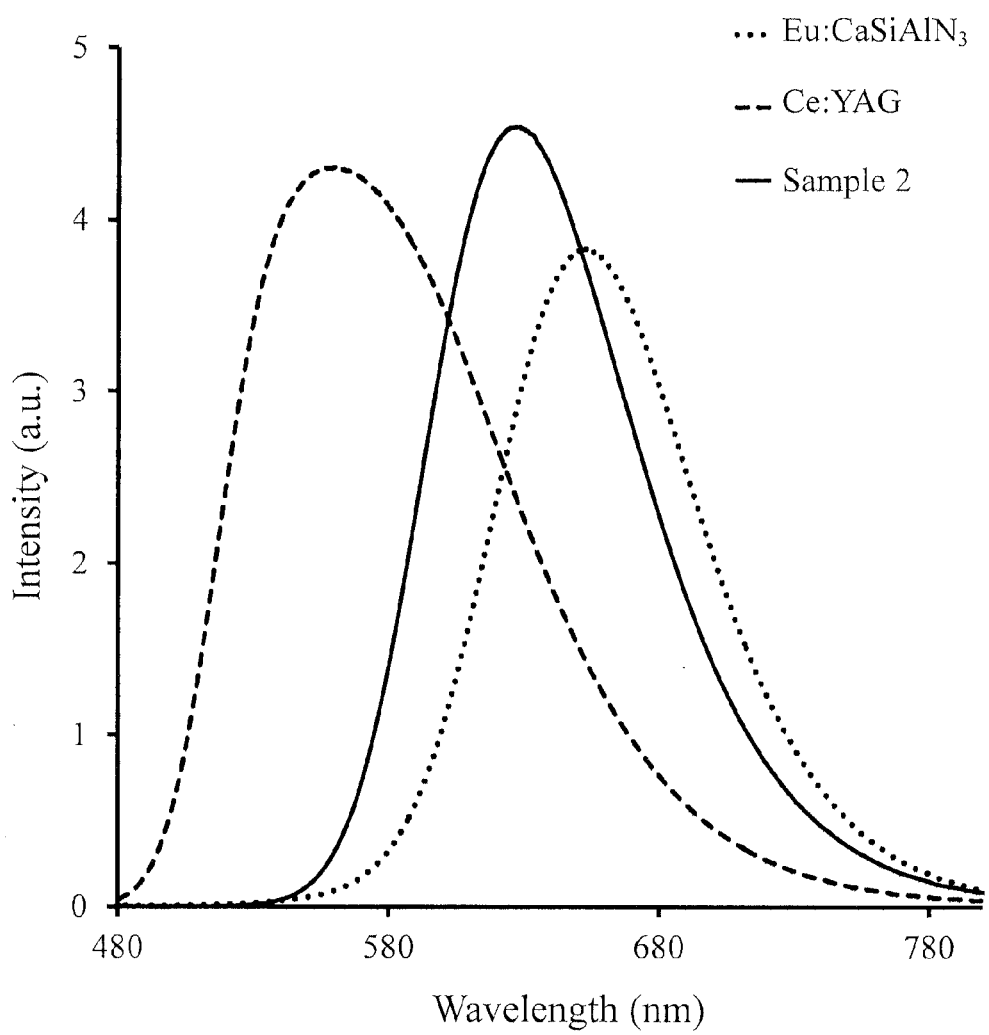
FIG. 19 shows emission spectra for a prior art yellow Ce doped YAG phosphor, a prior art Eu doped (650 nm) red phosphor $CaAlSiN_3$, and a 630 nm Eu doped red phosphor $Ca_{0.1}Sr_2Si_{4.8}Al_{0.2}N_8$ in accordance with an embodiment of the present invention.

FIG. 19 shows a comparison of emission spectra for: a state of the art yellow Ce doped YAG phosphor; a Eu doped (650 nm) red phosphor $CaAlSiN_3$ and a 630 nm Eu doped red phosphor $Ca_{0.1}Sr_2Si_{4.8}Al_{0.2}N_8$ (Sample 2) in accordance with an embodiment of the invention. Each of the spectra were measured for a 450 nm Blue LED excitation source.

The Present Red Nitrides as Part of a White LED

Figure 15:
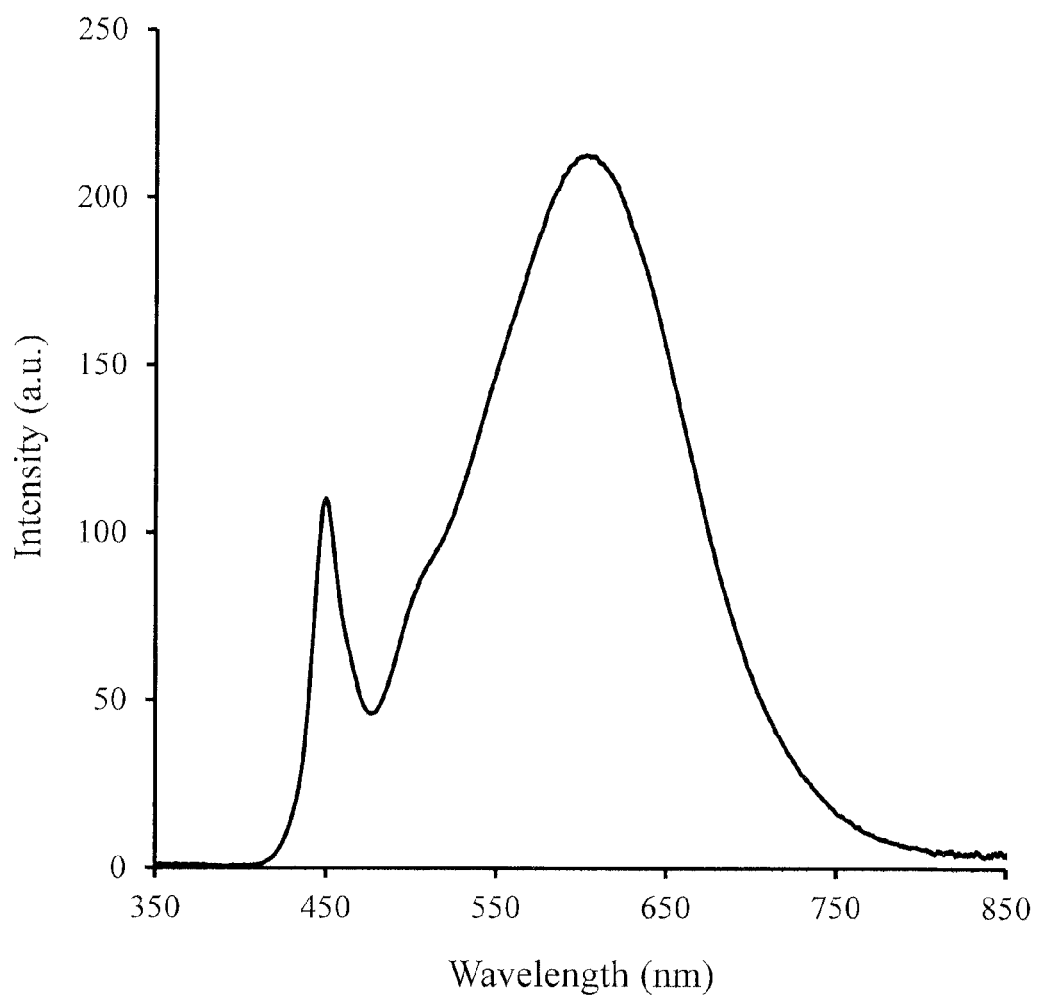
FIG. 15 shows the emission spectrum of a white LED (3000K) comprising a blue InGaN LED, a red phosphor having the formula $Eu_{0.05}Ca_{0.1}Sr_{1.95}Si_{4.8}Al_{0.2}N_8$ (Sample 2), and a green phosphor having the formula $Ce:Lu_3Al_5O_{12}$, according to some embodiments of the present invention.
Figure 16:
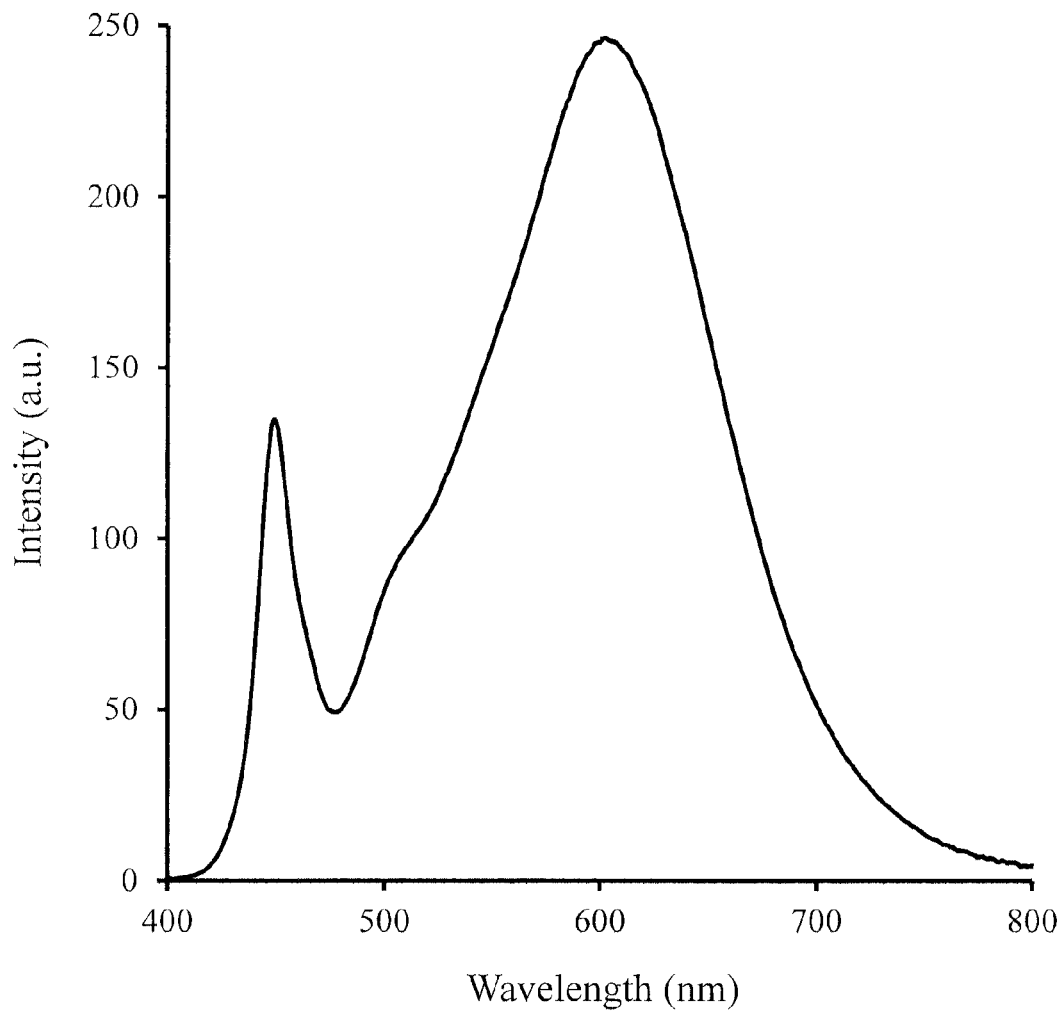
FIG. 16 shows the emission spectrum from a white LED (3000K) comprising a blue InGaN LED, a red phosphor having the formula $Eu_{0.05}Ca_{0.1}Sr_{1.95}Si_{4.8}B_{0.2}N_8$ (Sample 3) and a green phosphor having the formula $Ce:Lu_3Al_5O_{12}$, according to some embodiments of the present invention.

FIG. 15 shows the spectrum from a white LED (3000K) comprising a blue InGaN LED; a red phosphor having the formula $Eu_{0.05}Ca_{0.1}Sr_{1.95}Si_{4.8}Al_{0.2}N_8$ (from Sample 2); and a green phosphor having the formula $Ce:Lu_3Al_5O_{12}$; and FIG. 16 shows the spectrum from a white LED (3000K) comprising a blue InGaN LED; a red phosphor having the formula $Eu_{0.05}Ca_{0.1}Sr_{1.95}Si_{4.8}B_{0.2}N_8$ (from Sample 3); and a green phosphor having the formula $Ce:Lu_3Al_5O_{12}$.

Reliability Testing

Within many territories including the United States, regulatory bodies set performance criteria for replacement LED lamps. For example the US Environmental Protection Agency (EPA) in conjunction with the US Department of Energy (DOE) promulgates performance specifications under which a lamp may be designated as an "ENERGY STAR®" compliant product, e.g. identifying the power usage requirements, minimum light output requirements, luminous intensity distribution requirements, luminous efficacy requirements, life expectancy, etc. The ENERGY STAR® "Program Requirements for Integral LED Lamps" requires that for all LED lamps "the change of chromaticity over the minimum lumen maintenance test period (6000 hours) shall be within 0.007 on the CIE 1976 (u',v') diagram" and depending on lamp type, the lamp must have "≥70% lumen maintenance (L70) at 15,000 or 25,000 hours of operation". The ENERGY STAR® requirements are for the lamp performance and include all components of the lamp such as the LEDs, phosphor, electronic driver circuitry, optics and mechanical components. In principal, the degradation in brightness of a white LED with aging can be due not only to the phosphor, but also to the blue LED chip. Additional sources of degradation can come from the packaging materials (such as the substrate), the bond wires and other components encapsulated with silicone. In contrast, the factors affecting the change in color coordination are dominated primarily by phosphor degradation. In terms of phosphor performance it is believed that in order to comply with ENERGY STAR® requirements would require a change in chromaticity (CIE $\Delta$ x, CIE $\Delta$ y) of ≤0.01 for each coordinate over 1000 hours for the phosphor under accelerated testing at 85° C. and 85% relative humidity. The accelerated testing is done on phosphor coated LEDs prepared as follows: phosphor particles are combined with a binder, such as epoxy or silicone, and then applied to the LED chip. The coated LED is placed in an oven at the specified temperature and humidity and operated continuously for the testing period.

Figure 17A:
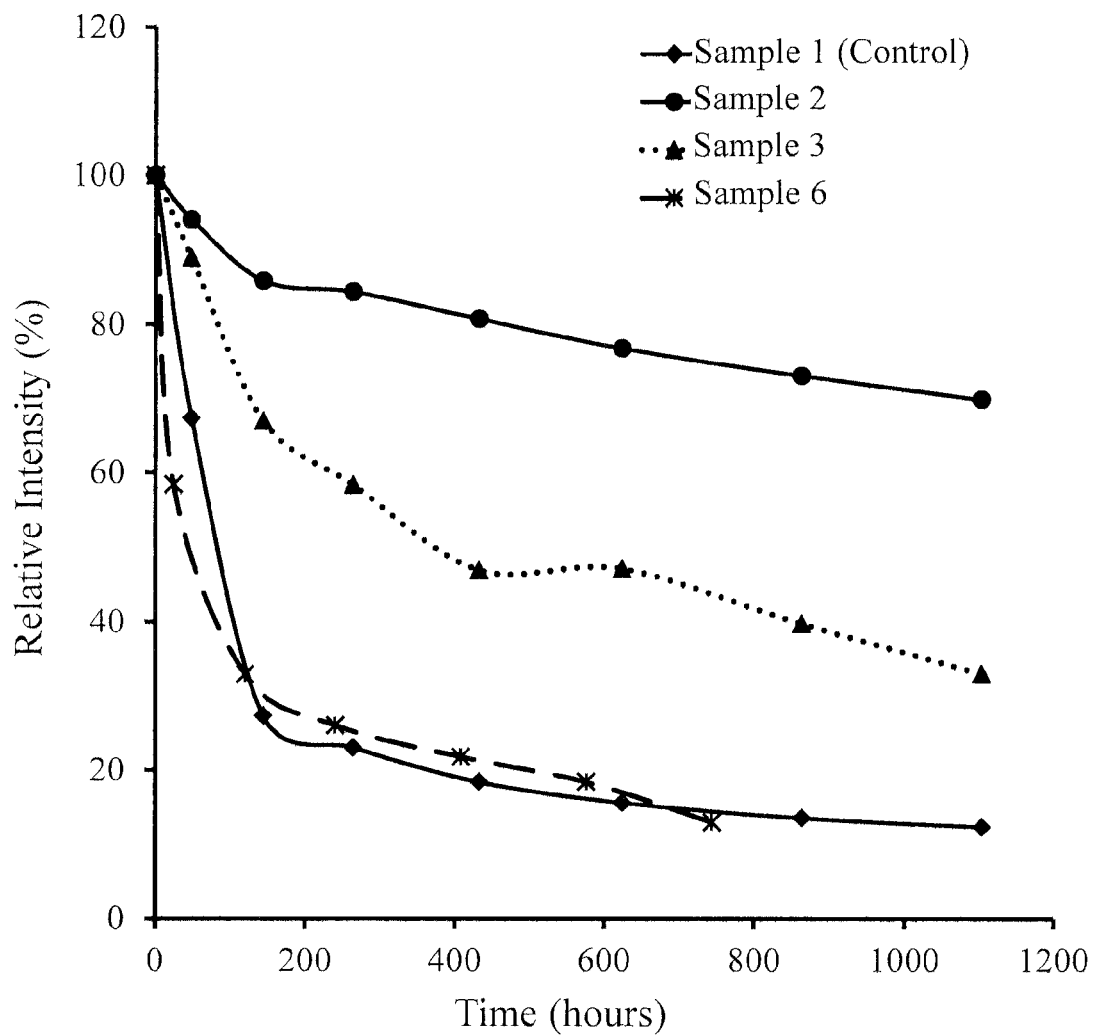
FIGS. 17A-C show the results of reliability testing under the conditions of 85° C. and 85% relative humidity of the phosphor of Samples 1 through 3 and 6, where
Figure 17B:
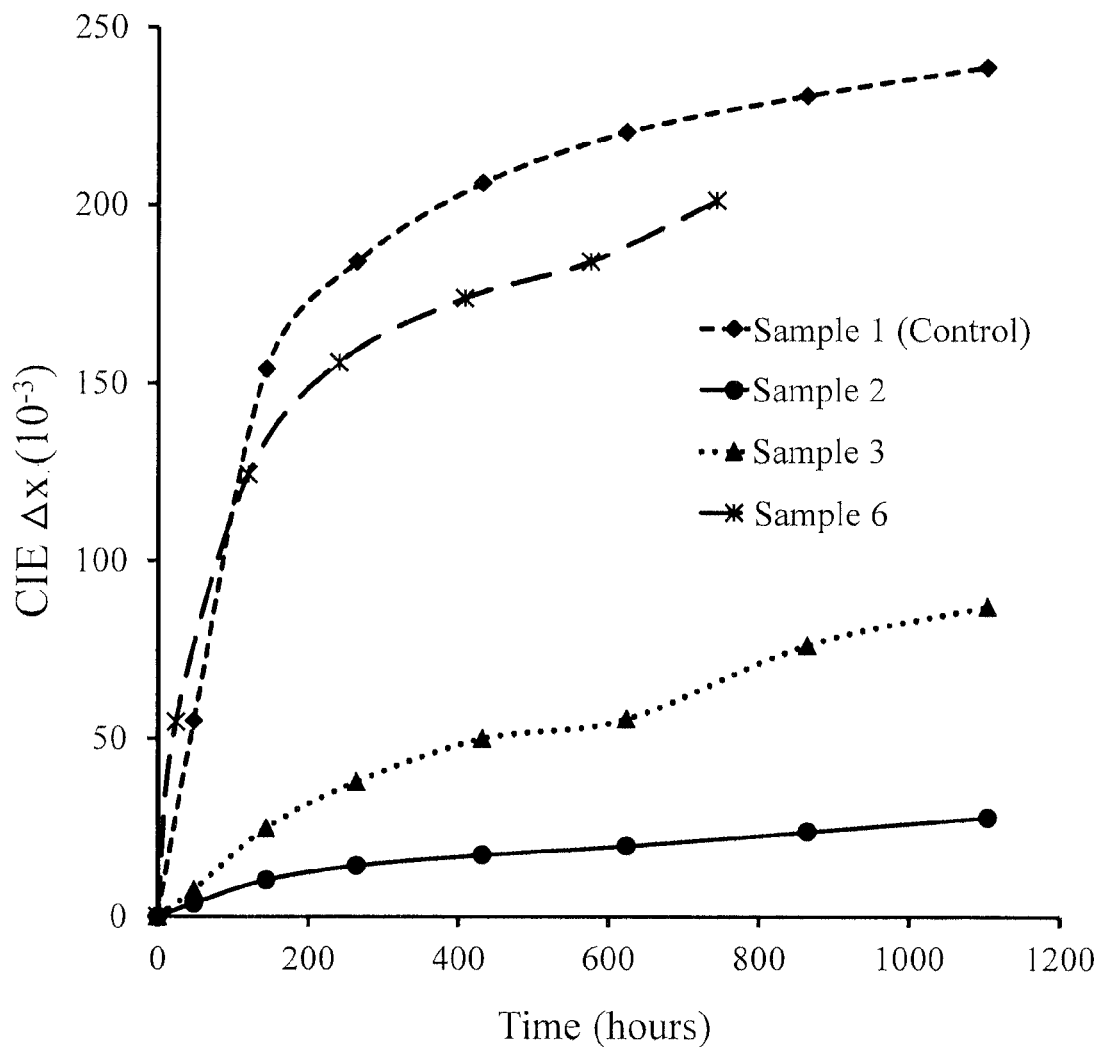
Figure 17C:
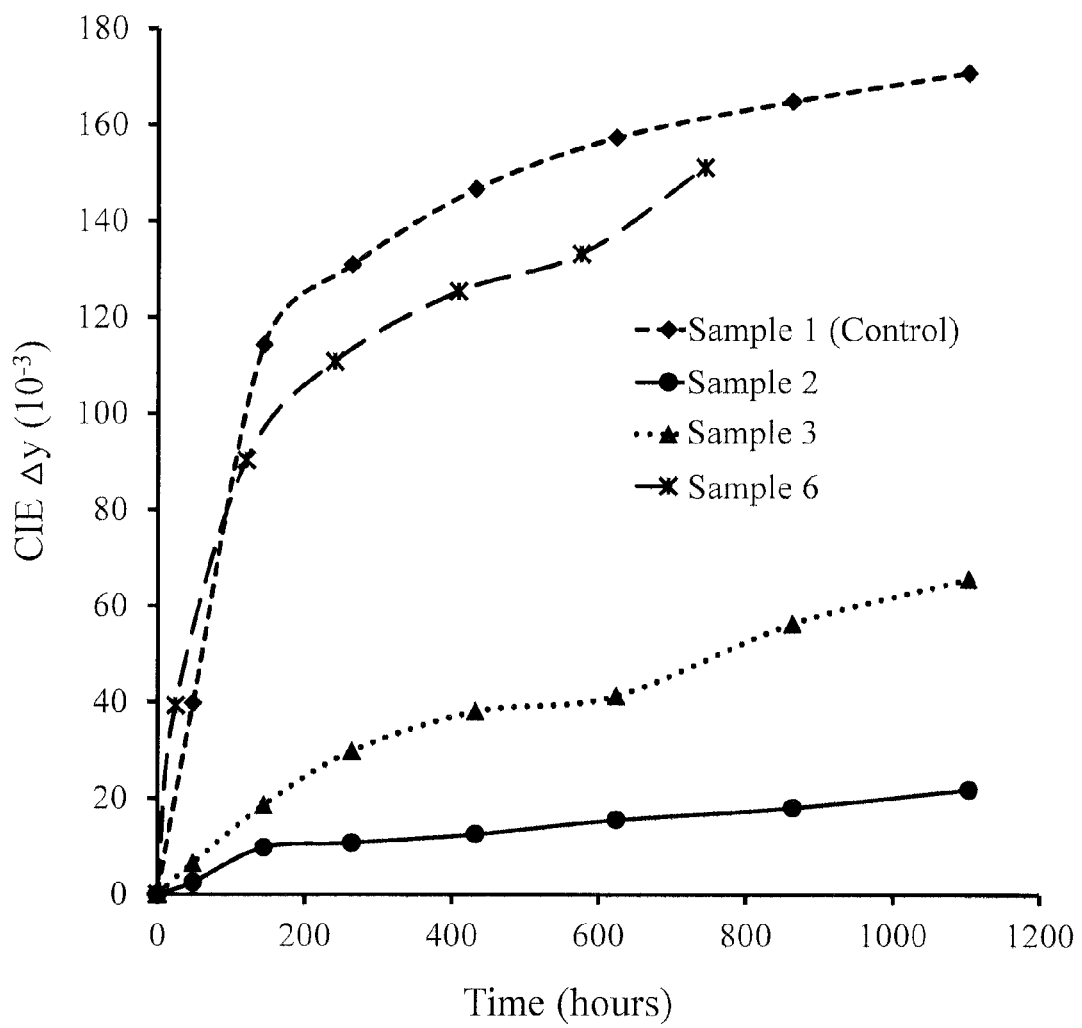

FIGS. 17A-C show the results of reliability testing under the conditions of 85° C. and 85% relative humidity of the phosphor of Samples 1 through 3 and 6. FIGS. 17A-C show the change in photoluminescent intensity (brightness) and the change in CIE chromaticity coordinates of 3000K white LEDs (as shown in the spectra of FIGS. 15 & 16) with time under the accelerated conditions of 85° C. and 85% relative humidity. Both the $Sr_2Si_5N_8$ control sample and the phosphor of Sample 6 ($Eu_{0.05}Sr_{1.95}Si_{4.8}Al_{0.2}N_{7.8}O_{0.2}$) with LED conversion showed results that would typically be unacceptable to the industry. The most significant improvement in stability, as defined by maintaining intensity and chromaticity, is unexpectedly realized by a Ca interstitial charge balancing and Al substituting for Si as exemplified by Sample 2 (see Table 2A). Sample 3 showed a lesser relative improvement in stability; Sample 3 is the B containing sample.

Figure 18A:
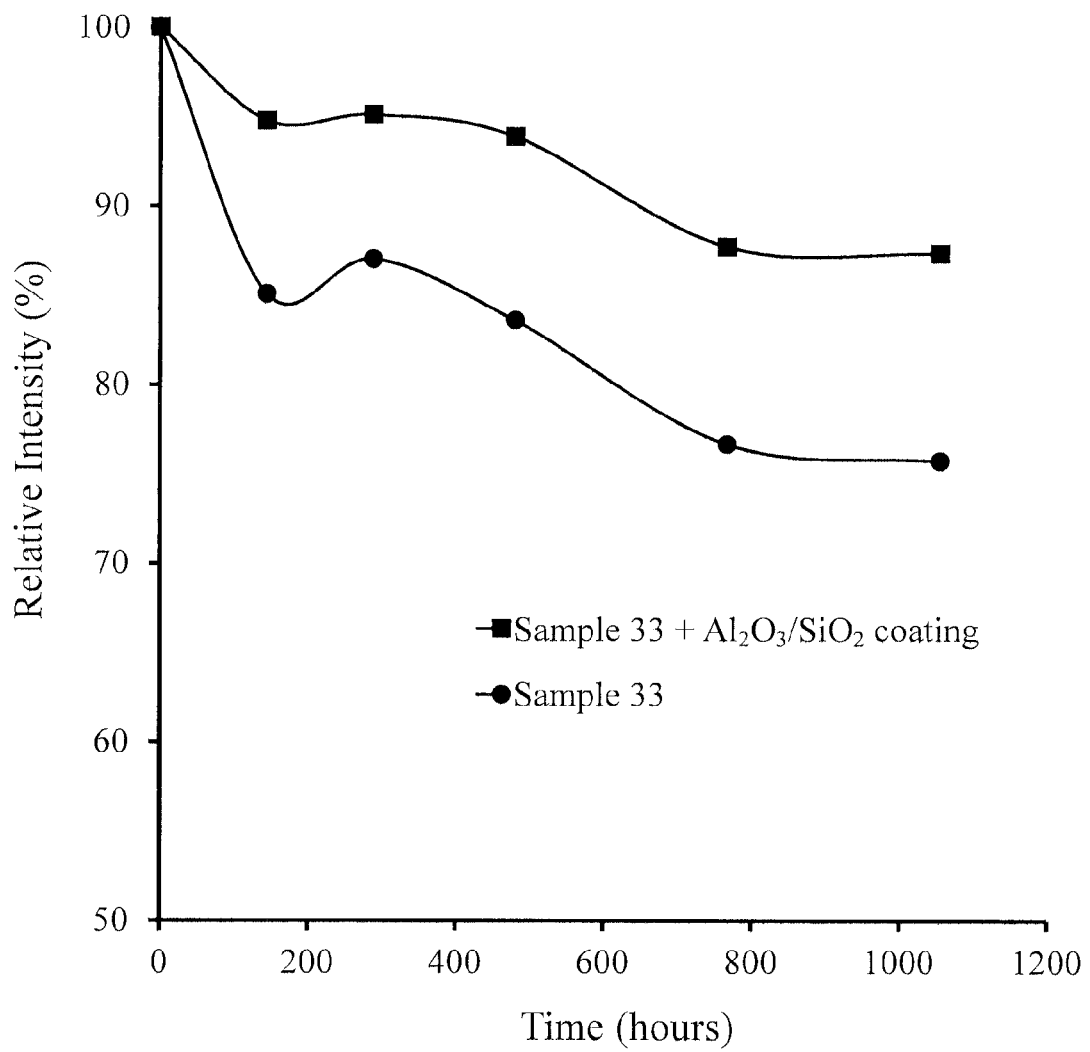
FIGS. 18A-C show the results of reliability testing under the conditions of 85° C. and 85% relative humidity of the phosphor of Sample 33 (which has the same composition as Sample 2) uncoated and coated with $Al_2O_3/SiO_2$, where FIG.
Figure 18B:
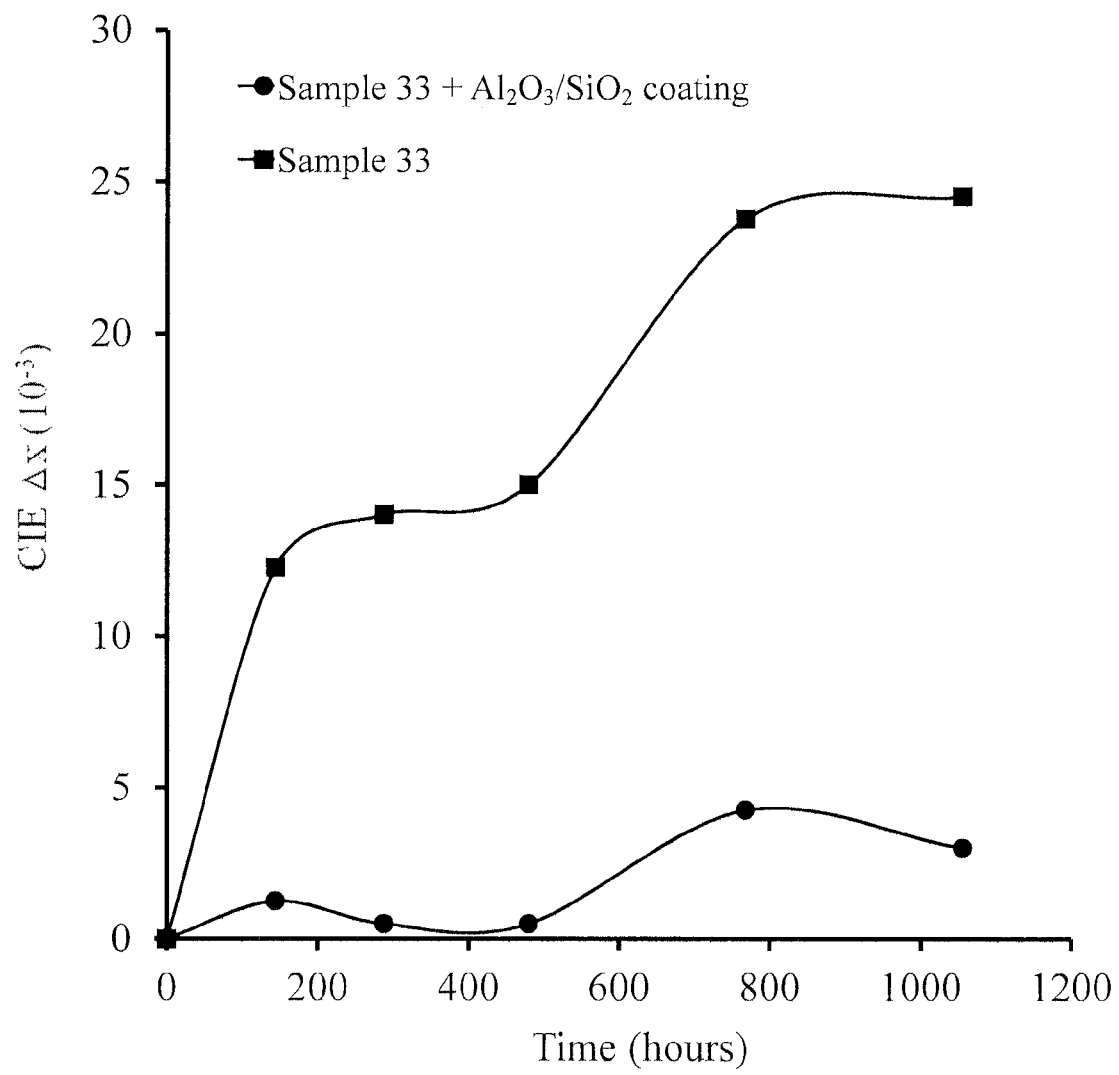
Figure 18C:
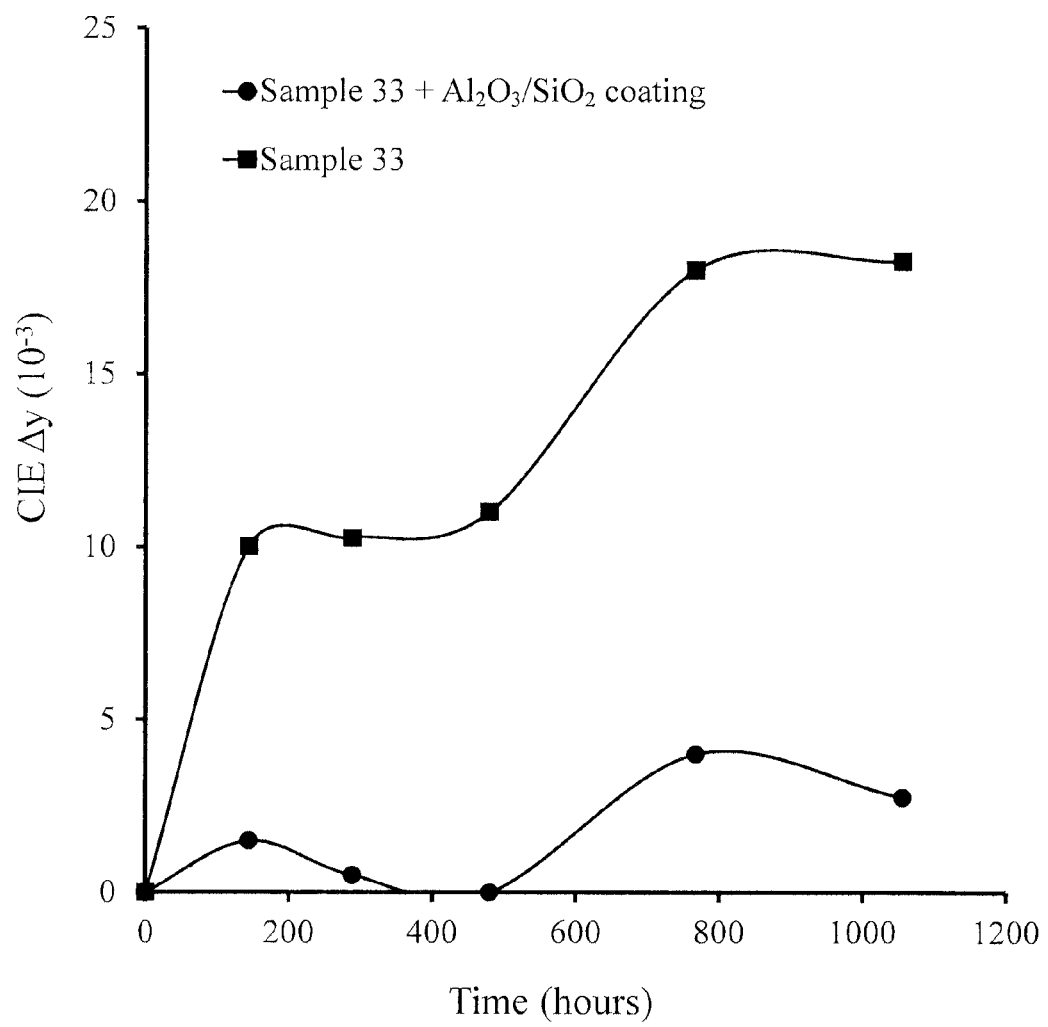

To provide a further improvement in performance in order to comply with ENERGY STAR® requirements the particles of the phosphor with the composition of Sample 2 can be coated with one or more coatings of, for example, $SiO_2$, $Al_2O_3$ and/or $TiO_2$, as taught in co-pending patent applications U.S. application Ser. No. 13/671,501 (now U.S. Pat. No. 9,006,966) for COATINGS FOR PHOTOLUMINESCENT MATERIALS and U.S. application Ser. No. 13/273,166 (published as U.S. Patent Appl. Pub. No. US2013/0092964 A1) for HIGHLY RELIABLE PHOTOLUMINESCENT MATERIALS HAVING A THICK AND UNIFORM TITANIUM DIOXIDE COATING, the content of each of which is incorporated in its entirety by way of reference thereto. FIGS. 18A-18C show the phosphor of Sample 33 (which has the same composition as Sample 2) with an $Al_2O_3/SiO_2$ coating. As can be seen from these figures the coated phosphor meets the accelerated testing criteria used to establish ENERGY STAR® compliance.

Synthesis of the Present Phosphors

For each of the examples and comparative examples described herein, the starting materials included at least one of the compounds $Si_3N_4$, AlN, $Ca_3N_2$, $Sr_3N_2$, BN, GaN, $SiO_2$, $Al_2O_3$, and $EuCl_3$.

Samples 1 Through 4

To obtain desired compositions of the phosphors exemplified in Samples 1 through 4, solid powders were weighed according to the compositions listed in Table 2A. This mixture of raw materials were then loaded into a plastic milling bottle together with milling beads, sealed in a glove box, followed by a ball milling process for about 2 hours. The mixed powders were then loaded into a molybdenum crucible having an inner diameter of 30 mm and a height of 30 mm; the loaded crucible was covered with a molybdenum lid and placed into a gas sintering furnace equipped with a graphite heater.

After loading the crucible, the furnace was evacuated to $10^{-2}$ Pa, and the sample heated to 150° C. under these vacuum conditions. At the 150° C. temperature, a high purity $N_2$ gas was introduced into the chamber; the temperature of the furnace was then increased to about 1700° C. at a substantially constant heating rate of 4° C./min. The samples were maintained at 1700° C. for about 7 hours.

After firing, the power was shut off and the samples allowed to cool in the furnace. The as-sintered phosphor was ground slightly, ball milled to a certain particle size, followed by a wash, dry and sieve procedure. The final product was tested using an Ocean Optics USB4000 spectrometer for photoluminescence intensity (PL) and chromaticity (CIE coordinates x and y). The x-ray diffraction (XRD) patterns of the phosphors of Samples 1 through 4 were measured using the $K_\alpha$ line of a Cu target.

Figure 2:
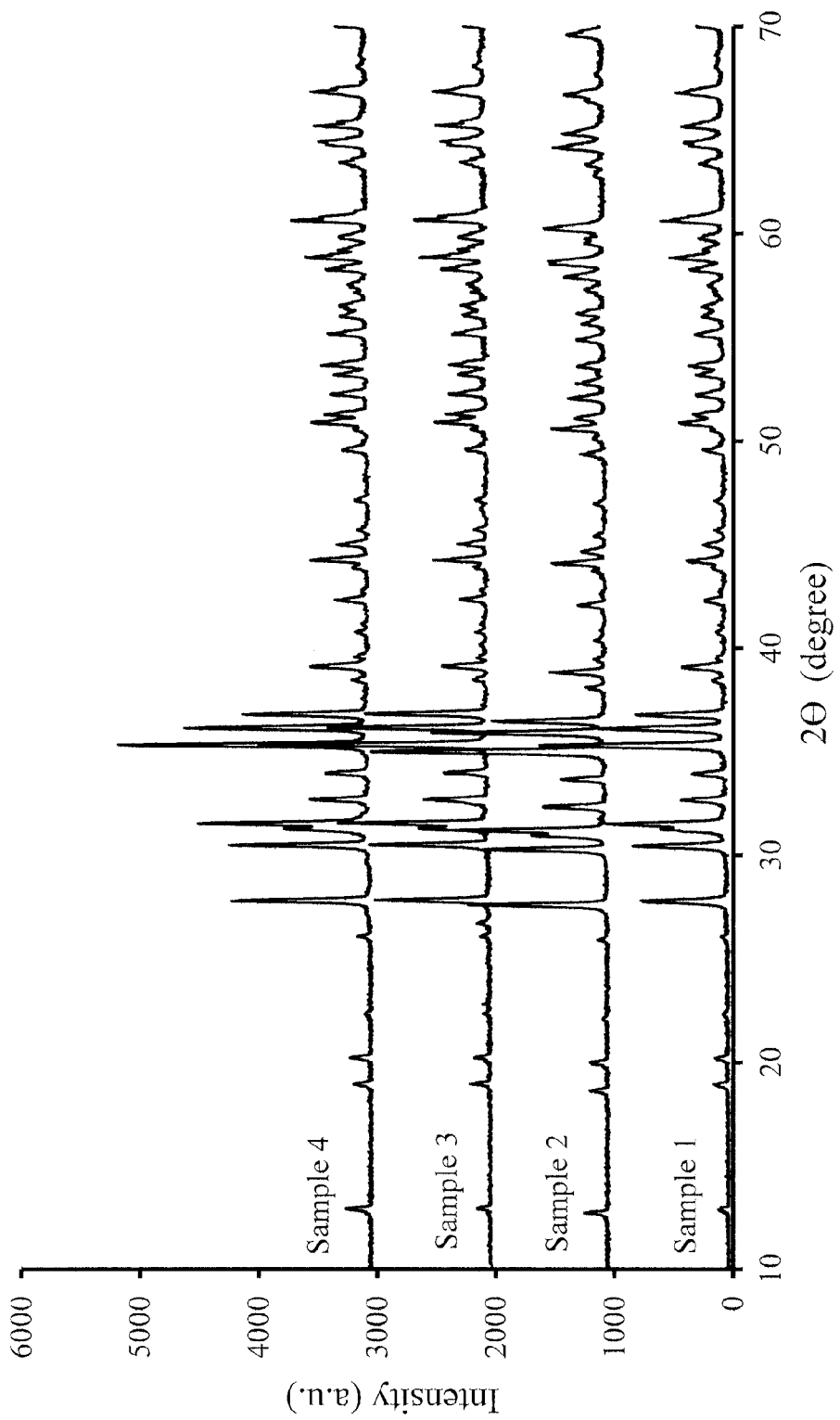
FIG. 2 shows x-ray diffraction patterns for the phosphors from Samples 1 through 4, according to some embodiments of the present invention.
Figure 3:
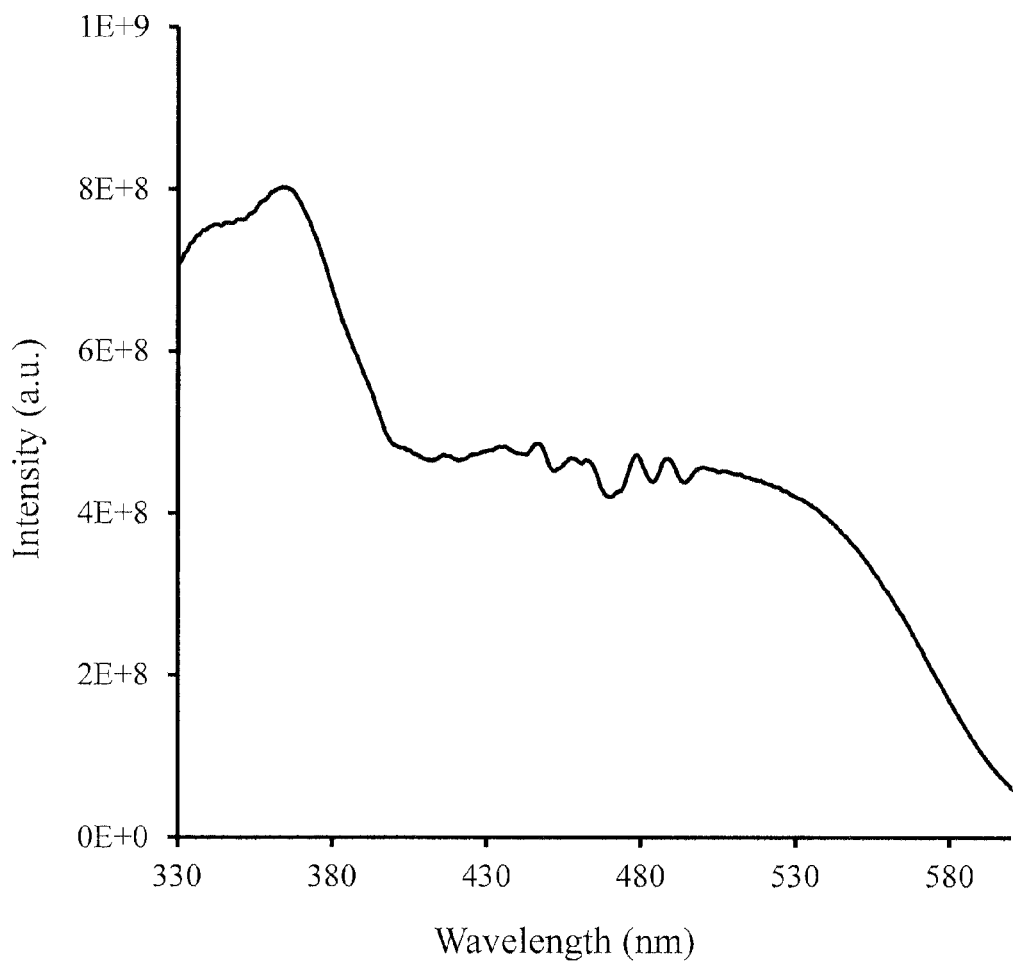
FIG. 3 shows an excitation spectrum of the compound $Eu_{0.05}Ca_{0.1}Sr_{1.95}Si_{4.8}Al_{0.2}N_8$ (Sample 2) illustrating that the phosphors may be efficiently excited by radiation ranging from the UV to the blue regions of the electromagnetic spectrum, according to some embodiments of the present invention.
Figure 4:
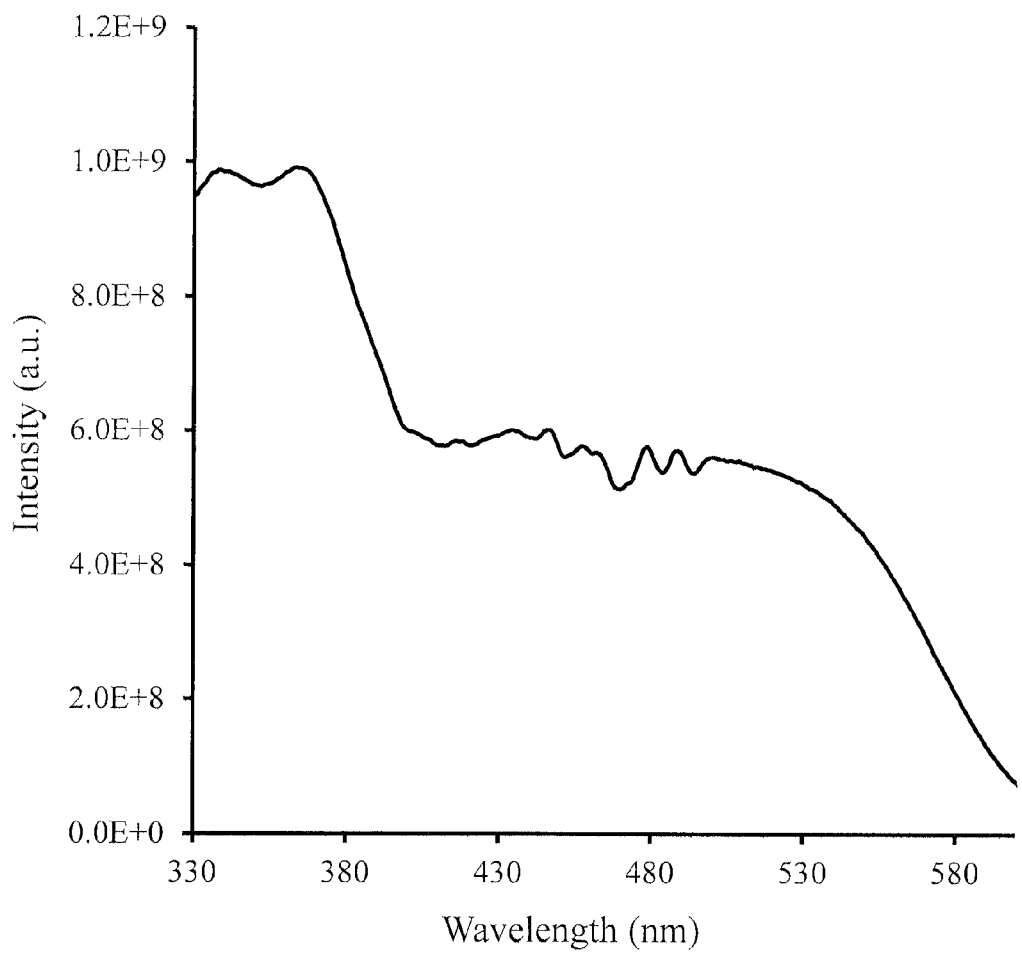
FIG. 4 shows an excitation spectrum of the compound $Eu_{0.05}Ca_{0.1}Sr_{1.95}Si_{4.8}B_{0.2}N_8$ (Sample 3) illustrating that the phosphors may be efficiently excited by radiation ranging from the UV to the blue regions of the electromagnetic spectrum, according to some embodiments of the present invention.

The test results of the phosphors of Samples 1 through 4 are listed in Table 2B. FIG. 1 shows the emission spectra results. FIG. 2 shows the XRD patterns. Note that the phosphor Sample 33 was made using the same method as for Sample 2.

TABLE 2A

Composition of starting raw materials for Samples 1 through 4

| Compound | $EuCl_3$ | $Sr_3N_2$ | $Ca_3N_2$ | $Si_3N_4$ | AlN | BN | GaN | $SiO_2$ | $Al_2O_3$ |
|---|---|---|---|---|---|---|---|---|---|
| Sample 1 | 2.5833 | 37.8131 | — | 46.7629 | — | — | — | — | — |
| Sample 2 | 2.5833 | 37.8131 | 0.987 | 44.8915 | 1.6396 | — | — | — | — |
| Sample 3 | 2.5833 | 37.8131 | 0.987 | 44.8915 | — | 0.9928 | — | — | — |
| Sample 4 | 2.5833 | 37.8131 | 0.987 | 44.8915 | — | — | 3.3492 | — | — |

TABLE 2B

Composition and Emission Peak Wavelength, Intensity and CIE of Samples 1 through 4

| | | Test Results | | | |
|---|---|---|---|---|---|
| Sample | Composition | Emission Peak Wavelength (nm) | Intensity (a.u.) | CIE (x) | CIE (y) |
| 1 (Control) | $Eu_{0.05}Sr_{1.95}Si_5N_8$ | 623 | 5.82 | 0.640 | 0.360 |
| 2 | $Eu_{0.05}Ca_{0.1}Sr_{1.95}Si_{4.8}Al_{0.2}N_8$ | 629 | 5.76 | 0.642 | 0.358 |
| 3 | $Eu_{0.05}Ca_{0.1}Sr_{1.95}Si_{4.8}B_{0.2}N_8$ | 624 | 6.51 | 0.640 | 0.359 |
| 4 | $Eu_{0.05}Ca_{0.1}Sr_{1.95}Si_{4.8}Ga_{0.2}N_8$ | 624 | 6.105 | 0.642 | 0.358 |

Samples 5 Through 8

To obtain design compositions of phosphors, solid powders were weighed according to the mixture compositions listed in Table 3A, the same synthesizing procedure as described in Samples 1 through 4 were used. The test results are listed in Table 3B.

Figure 6:
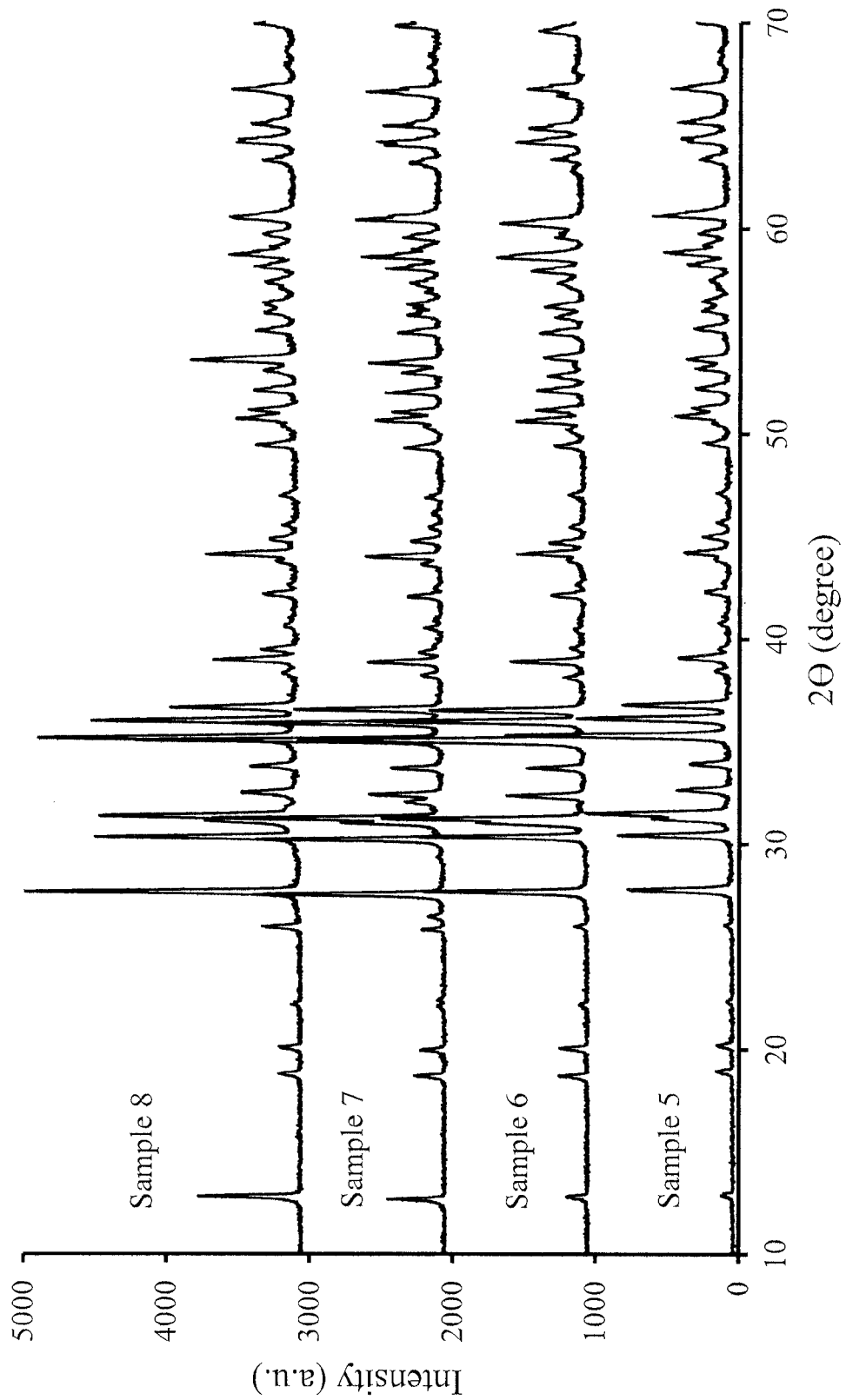
FIG. 6 shows x-ray diffraction patterns of the phosphors from Samples 5-8, according to some embodiments of the present invention.

FIG. 5 is the emission spectra of the phosphors from Samples 5 through 8. Powder x-ray diffraction measurements using the $K_\alpha$ line of a Cu target are shown in FIG. 6 for the phosphors of Samples 5 through 8.

TABLE 3A

Composition of starting raw materials for Samples 5 through 8

| Compound | $EuCl_3$ | $Sr_3N_2$ | $Ca_3N_2$ | $Si_3N_4$ | AlN | BN | GaN | $SiO_2$ | $Al_2O_3$ |
|---|---|---|---|---|---|---|---|---|---|
| Sample 5 | 2.5833 | 37.8131 | — | 46.7629 | — | — | — | — | — |
| Sample 6 | 2.5833 | 37.8131 | — | 44.8915 | 0.5468 | — | — | — | 1.3602 |
| Sample 7 | 2.5833 | 37.8131 | — | 43.9572 | — | 0.9928 | — | 1.2017 | — |
| Sample 8 | 2.5833 | 37.8131 | — | 43.9572 | — | — | 3.3492 | 1.2017 | — |

TABLE 3B

Composition and Emission Peak Wavelength, Intensity and CIE of Samples 5 through 8

| | | Test Results | | | |
|---|---|---|---|---|---|
| Sample | Composition | Emission Peak Wavelength (nm) | Intensity (a.u.) | CIE (x) | CIE (y) |
| 5 (Control) | $Eu_{0.05}Sr_{1.95}Si_5N_8$ | 623 | 5.82 | 0.640 | 0.360 |
| 6 | $Eu_{0.05}Sr_{1.95}Si_{4.8}Al_{0.2}N_{7.8}O_{0.2}$ | 629 | 5.76 | 0.642 | 0.358 |
| 7 | $Eu_{0.05}Sr_{1.95}Si_{4.8}B_{0.2}N_{7.8}O_{0.2}$ | 623 | 5.49 | 0.640 | 0.359 |
| 8 | $Eu_{0.05}Sr_{1.95}Si_{4.8}Ga_{0.2}N_{7.8}O_{0.2}$ | 626 | 5.29 | 0.641 | 0.358 |

Samples 9 Through 12

To obtain design compositions of phosphors, solid powders were weighed according to the mixture compositions listed in Table 4A, the same synthesizing procedure as described in Samples 1 through 4 were used. The test results are listed in Table 4B.

Figure 8:
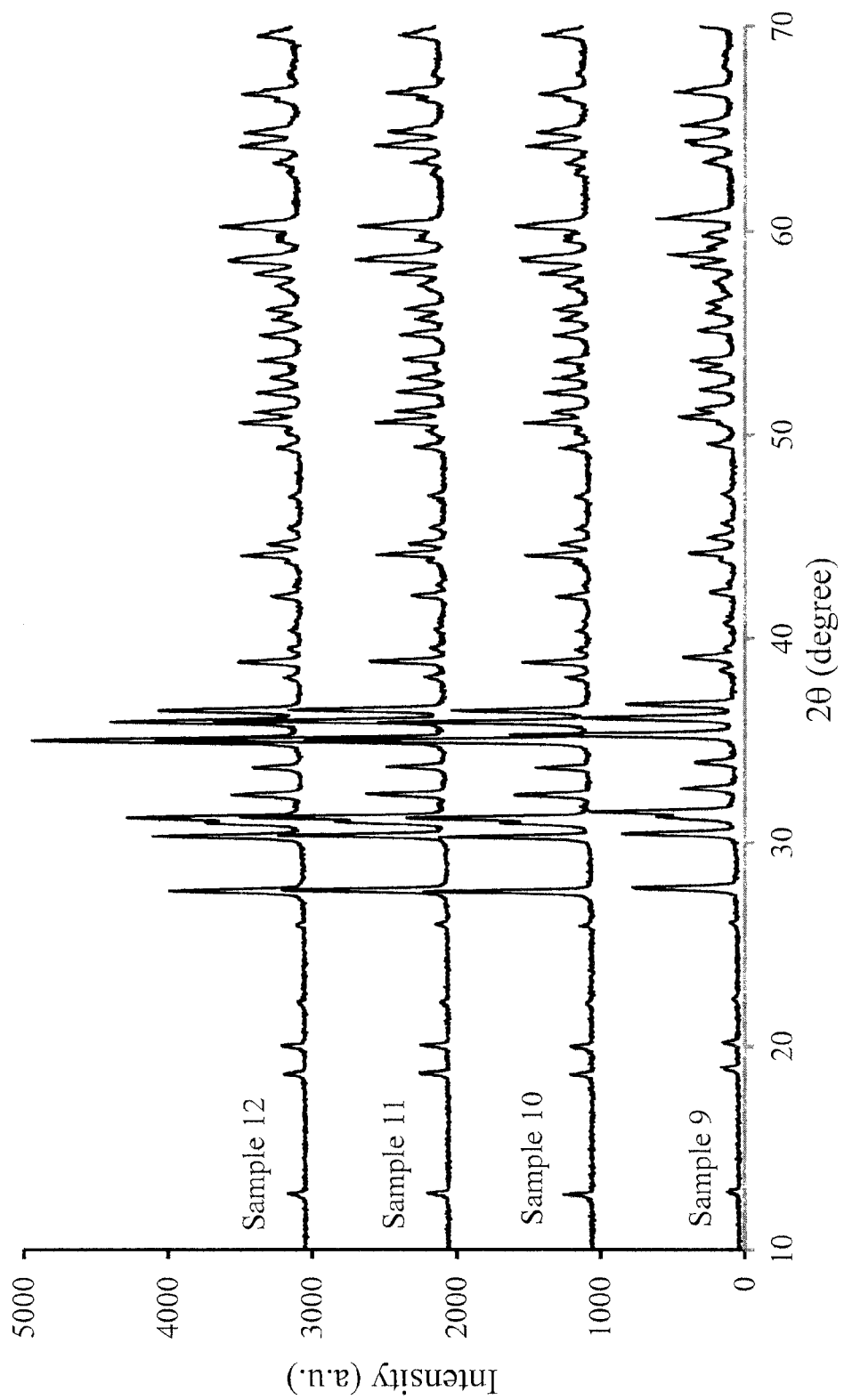
FIG. 8 shows x-ray diffraction patterns of the phosphors from Samples 9 through 12, according to some embodiments of the present invention.

FIG. 7 is the emission spectra of the phosphors from Samples 9 through 12. Powder x-ray diffraction measurements using the $K_\alpha$ line of a Cu target are shown in FIG. 8 for the phosphors of Samples 9 through 12.

TABLE 4A

Composition of starting raw materials Samples 9 through 12

| Compound | EuCl$_3$ | Sr$_3$N$_2$ | Ca$_3$N$_2$ | Si$_3$N$_4$ | AlN | BN | GaN | SiO$_2$ | Al$_2$O$_3$ |
|---|---|---|---|---|---|---|---|---|---|
| Sample 9  | 2.5833 | 37.8131 | —     | 46.7629 | —      | — | — | — | —      |
| Sample 10 | 2.5833 | 37.8131 | 0.987 | 44.8915 | 1.6395 | — | — | — | —      |
| Sample 11 | 2.5833 | 37.8131 | —     | 44.8915 | 0.5468 | — | — | — | 1.3602 |
| Sample 12 | 2.5833 | 37.8131 | —     | 44.8915 | 1.6396 | — | — | — | —      |

TABLE 4B

Composition and Emission Peak wavelength, Intensity and CIE of Samples 9 through 12

| Sample | Composition | Emission Peak Wavelength (nm) | Intensity (a.u.) | CIE (x) | CIE (y) |
|---|---|---|---|---|---|
| 9 (Control) | $Eu_{0.05}Sr_{1.95}Si_5N_8$ | 623 | 5.82 | 0.640 | 0.360 |
| 10 | $Eu_{0.05}Ca_{0.1}Sr_{1.95}Si_{4.8}Al_{0.2}N_8$ | 629 | 5.76 | 0.642 | 0.358 |
| 11 | $Eu_{0.05}Sr_{1.95}Si_{4.8}Al_{0.2}N_{7.8}O_{0.2}$ | 629 | 5.49 | 0.642 | 0.358 |
| 12 | $Eu_{0.05}Sr_{1.95}Si_{4.8}Al_{0.2}N_{7.93}$ | 626 | 4.87 | 0.637 | 0.363 |

Samples 13 Through 16

To obtain design compositions of phosphors, solid powders were weighed according to the mixture compositions listed in Table 5A, the same synthesizing procedure as described in Samples 1 through 4 were used. The test results are listed in Table 5B.

Figure 10:
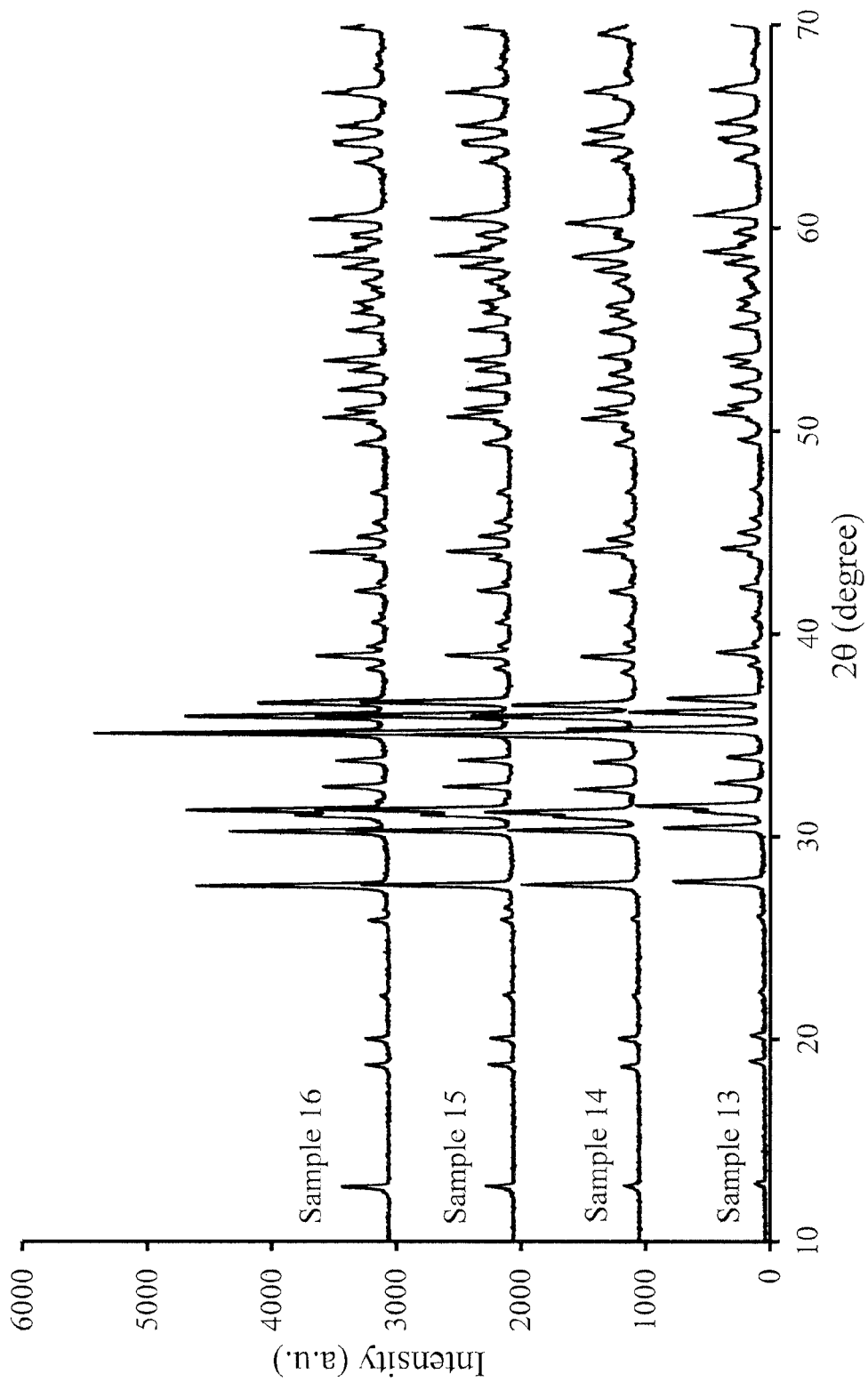
FIG. 10 shows x-ray diffraction patterns of the phosphors from Samples 13 through 16, according to some embodiments of the present invention.

FIG. 9 is the emission spectra of the phosphors from Samples 13 through 16. Powder x-ray diffraction measurements using the $K_\alpha$ line of a Cu target are shown in FIG. 10 for the phosphors of Samples 13 through 16.

TABLE 5A

Composition of starting raw materials Samples 13 through 16

| Compound | EuCl$_3$ | Sr$_3$N$_2$ | Ca$_3$N$_2$ | Si$_3$N$_4$ | AlN | BN | GaN | SiO$_2$ | Al$_2$O$_3$ |
|---|---|---|---|---|---|---|---|---|---|
| Sample 13 | 2.5833 | 37.8131 | — | 46.7629 | —      | —      | —      | — | — |
| Sample 14 | 2.5833 | 37.8131 | — | 44.8915 | 1.6396 | —      | —      | — | — |
| Sample 15 | 2.5833 | 37.8131 | — | 44.8915 | —      | 0.9928 | —      | — | — |
| Sample 16 | 2.5833 | 37.8131 | — | 44.8915 | —      | —      | 3.3492 | — | — |

TABLE 5B

Composition and Emission Peak wavelength, Intensity and CIE of Samples 13 through 16

| Sample | Composition | Emission Peak Wavelength (nm) | Intensity (a.u.) | CIE (x) | CIE (y) |
|---|---|---|---|---|---|
| 13 (Control) | $Eu_{0.05}Sr_{1.95}Si_5N_8$ | 623 | 5.82 | 0.640 | 0.360 |
| 14 | $Eu_{0.05}Sr_{1.95}Si_{4.8}Al_{0.2}N_{7.93}$ | 626 | 4.87 | 0.637 | 0.363 |
| 15 | $Eu_{0.05}Sr_{1.95}Si_{4.8}B_{0.2}N_{7.93}$ | 624 | 6.01 | 0.641 | 0.359 |
| 16 | $Eu_{0.05}Sr_{1.95}Si_{4.8}Ga_{0.2}N_{7.93}$ | 623 | 5.89 | 0.641 | 0.359 |

Sample 17 Through 21

To obtain the desired compositions of this group of phosphors, solid powders were weighed according to the mixture compositions listed in Table 6A, the same synthesis procedure as described in Samples 1 through 4 was used. The test results are listed in Table 6B.

Figure 12:
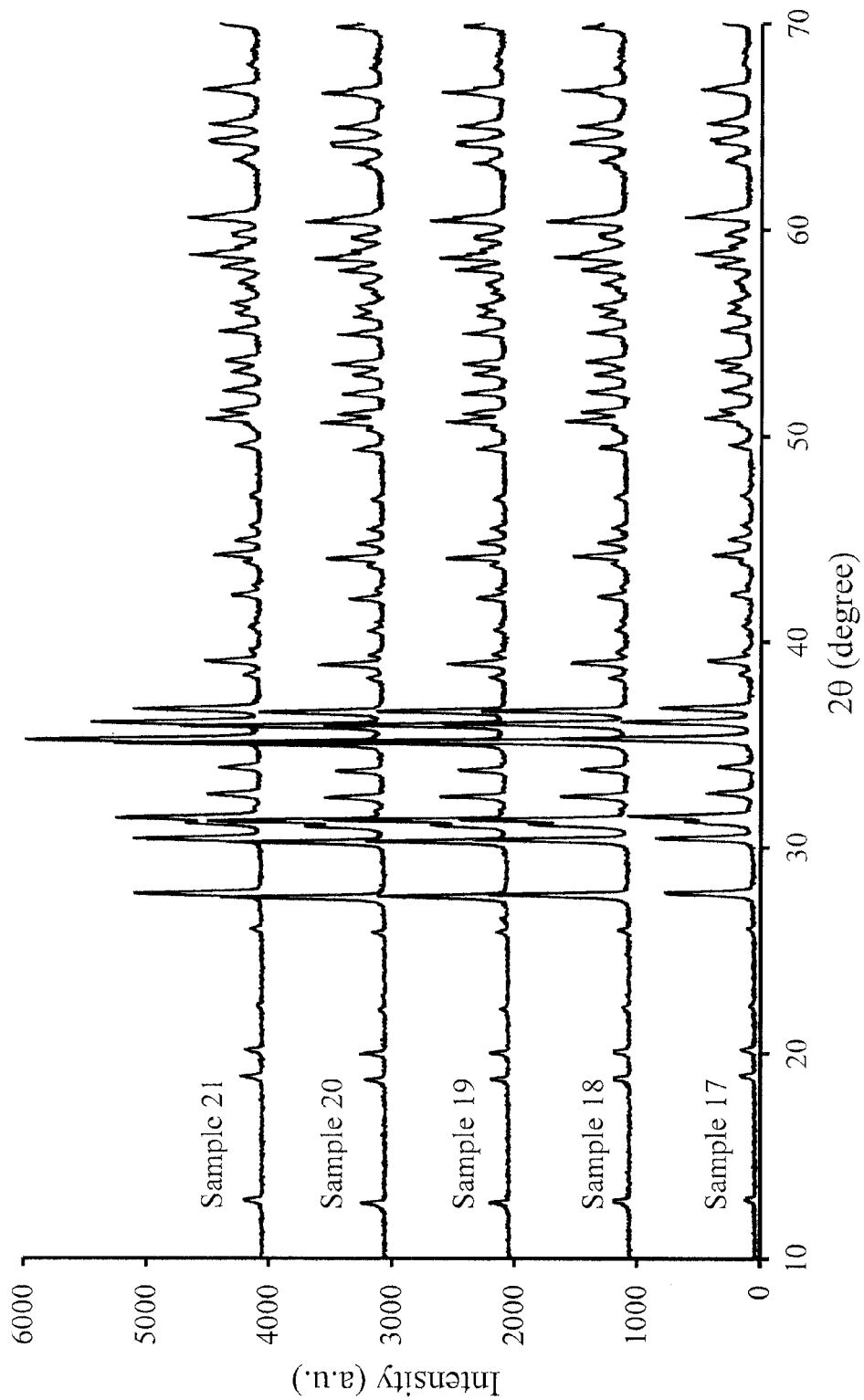
FIG. 12 shows x-ray diffraction patterns of the phosphors from Samples 17 through 21, according to some embodiments of the present invention.

FIG. 11 is the emission spectra of the phosphors from Samples 17 through 21. Powder x-ray diffraction measurements using the $K_\alpha$ line of a Cu target are shown in FIG. 12 for the phosphors of Samples 17-21.

TABLE 6A

Composition of starting raw materials for Samples 17 through 21

| Compound | $EuCl_3$ | $Sr_3N_2$ | $Ca_3N_2$ | $Si_3N_4$ | AlN | BN | GaN | $SiO_2$ | $Al_2O_3$ |
|---|---|---|---|---|---|---|---|---|---|
| Sample 17 | 2.5833 | 37.8131 | — | 46.7629 | — | — | — | — | — |
| Sample 18 | 2.5833 | 37.8131 | — | 46.7629 | 0.8198 | — | — | — | — |
| Sample 19 | 2.5833 | 37.8131 | — | 46.7629 | — | 0.4064 | — | — | — |
| Sample 20 | 2.5833 | 37.8131 | — | 46.7629 | — | — | 1.6746 | — | — |
| Sample 21 | 2.5833 | 37.8131 | 0.494 | 46.7629 | — | — | — | — | — |

TABLE 6B

Composition and Emission Peak wavelength, Intensity and CIE of Samples 17 through 21

| | | Testing Results | | | |
|---|---|---|---|---|---|
| Sample | Composition | Emission Peak Wavelength (nm) | Intensity (a.u.) | CIE (x) | CIE (y) |
| 17 (Control) | $Eu_{0.05}Sr_{1.95}Si_5N_8$ | 623 | 5.82 | 0.640 | 0.360 |
| 18 | $Eu_{0.05}Sr_{1.95}Si_5N_8 + 0.1\,AlN$ | 625 | 5.84 | 0.641 | 0.358 |
| 19 | $Eu_{0.05}Sr_{1.95}Si_5N_8 + 0.1\,BN$ | 625 | 5.87 | 0.642 | 0.357 |
| 20 | $Eu_{0.05}Sr_{1.95}Si_5N_8 + 0.1\,GaN$ | 624 | 5.76 | 0.640 | 0.360 |
| 21 | $Eu_{0.05}Sr_{1.95}Si_5N_8 + 0.033\,Ca_3N_2$ | 625 | 5.86 | 0.642 | 0.358 |

Samples 22 Through 27

To obtain the desired compositions of the phosphors of Samples 22 through 27, solid powders were weighed according to the compositions listed in Table 7A. The same synthesis procedure as that used for Samples 1 through 4 was used. The test results are listed in Table 7B.

Figure 14:
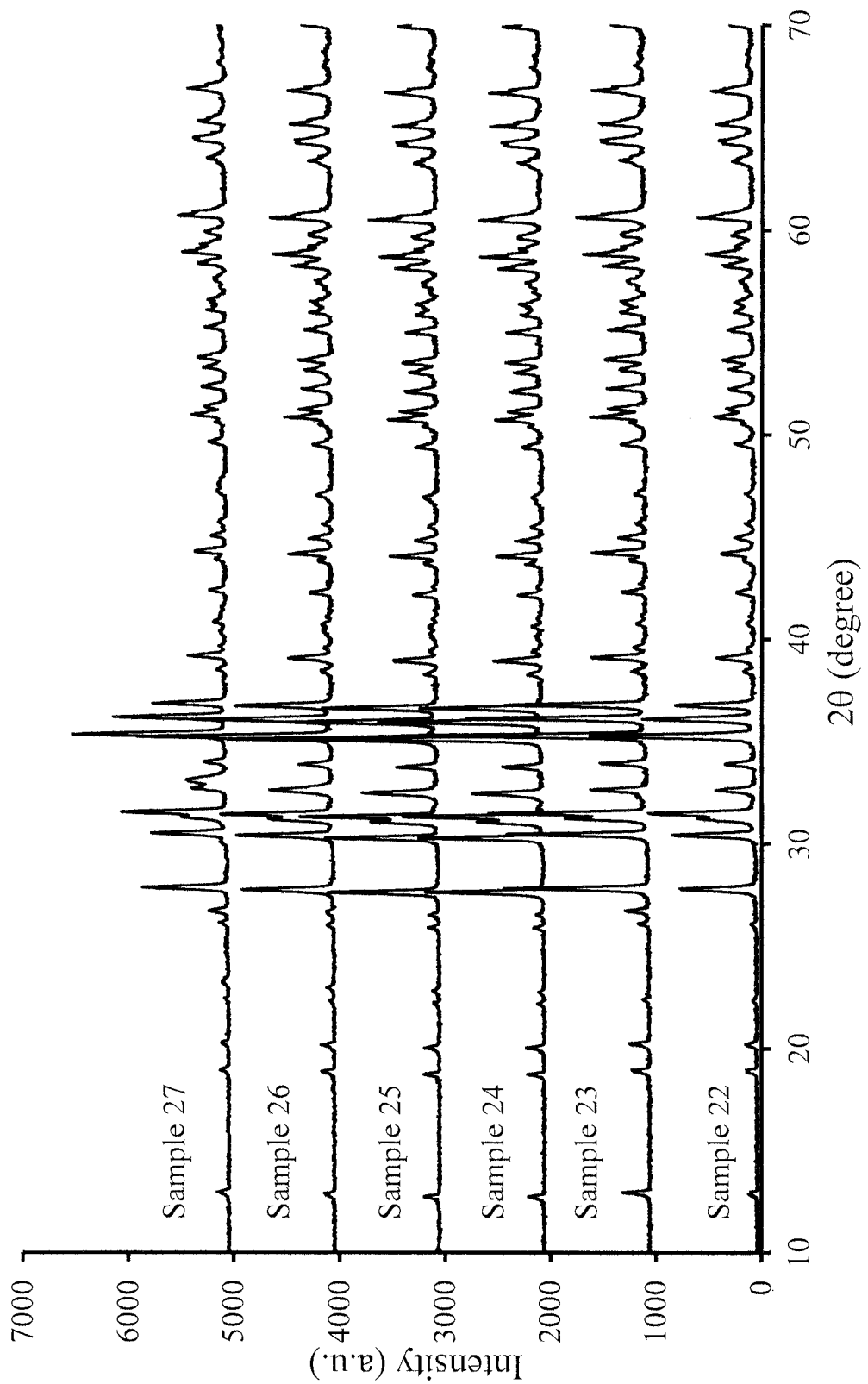
FIG. 14 shows x-ray diffraction patterns of the phosphors from Samples 22 through 27, according to some embodiments of the present invention.

FIG. 13 is the emission spectra of the phosphors from Samples 22 through 27. X-ray diffraction measurements using the $K_\alpha$ line of a Cu target were obtained, and the XRD patterns of Samples 22-27 are shown in FIG. 14.

TABLE 7A

Composition of starting raw materials for Samples 22 through 27

| Compound | $EuCl_3$ | $Sr_3N_2$ | $Ca_3N_2$ | $Si_3N_4$ | AlN | BN | GaN | $SiO_2$ | $Al_2O_3$ |
|---|---|---|---|---|---|---|---|---|---|
| Sample 22 | 2.5833 | 37.8131 | — | 46.7629 | — | — | — | — | — |
| Sample 23 | 2.5833 | 37.8131 | 0.987- | 44.8915 | — | 0.9928 | — | — | — |
| Sample 24 | 2.5833 | 37.8131 | 1.4825 | 43.9572 | — | 1.4892 | — | — | — |
| Sample 25 | 2.5833 | 37.8131 | 1.9776 | 43.0201 | — | 1.9856 | — | — | — |
| Sample 26 | 2.5833 | 37.8131 | 2.4698 | 42.0858 | — | 2.482 | — | — | — |
| Sample 27 | 2.5833 | 37.8131 | 4.9426 | 37.4087 | — | 4.964 | — | — | — |

TABLE 7B

Composition and Emission Peak wavelength, Intensity and CIE of Samples 22 through 27

| | | Testing Results | | | |
|---|---|---|---|---|---|
| Sample | Composition | Emission Peak Wavelength (nm) | Intensity (a.u.) | CIE (x) | CIE (y) |
| 22 (Control) | $Eu_{0.05}Sr_{1.95}Si_5N_8$ | 623 | 5.82 | 0.640 | 0.360 |
| 23 | $Eu_{0.05}Ca_{0.1}Sr_{1.95}Si_{4.8}B_{0.2}N_8$ | 624 | 6.51 | 0.640 | 0.359 |
| 24 | $Eu_{0.05}Ca_{0.15}Sr_{1.95}Si_{4.7}B_{0.3}N_8$ | 624 | 6.298 | 0.640 | 0.360 |

TABLE 7B-continued

Composition and Emission Peak wavelength, Intensity and CIE of Samples 22 through 27

| | | Testing Results | | | |
|---|---|---|---|---|---|
| Sample | Composition | Emission Peak Wavelength (nm) | Intensity (a.u.) | CIE (x) | CIE (y) |
| 25 | $Eu_{0.05}Ca_{0.2}Sr_{1.95}Si_{4.6}B_{0.4}N_8$ | 624 | 5.957 | 0.640 | 0.360 |
| 26 | $Eu_{0.05}Ca_{0.25}Sr_{1.95}Si_{4.5}B_{0.5}N_8$ | 625 | 5.76 | 0.642 | 0.358 |
| 27 | $Eu_{0.05}Ca_{0.5}Sr_{1.95}Si_4BN_8$ | 627 | 3.94 | 0.6408 | 0.3587 |

Samples 28 Through 32

To obtain the desired compositions of the phosphors of Samples 28 through 32, solid powders were weighed according to the compositions listed in Table 8A. The same synthesis procedure as that used for Samples 1 through 4 was used. The test results are listed in Table 8B. Note that the intensity measurements in Table 8B were made using different equipment than used for the intensity measurements of the samples listed in the other tables; the absolute intensity measurements using this different equipment are lower than for the equipment used for the other samples.

Figure 21:
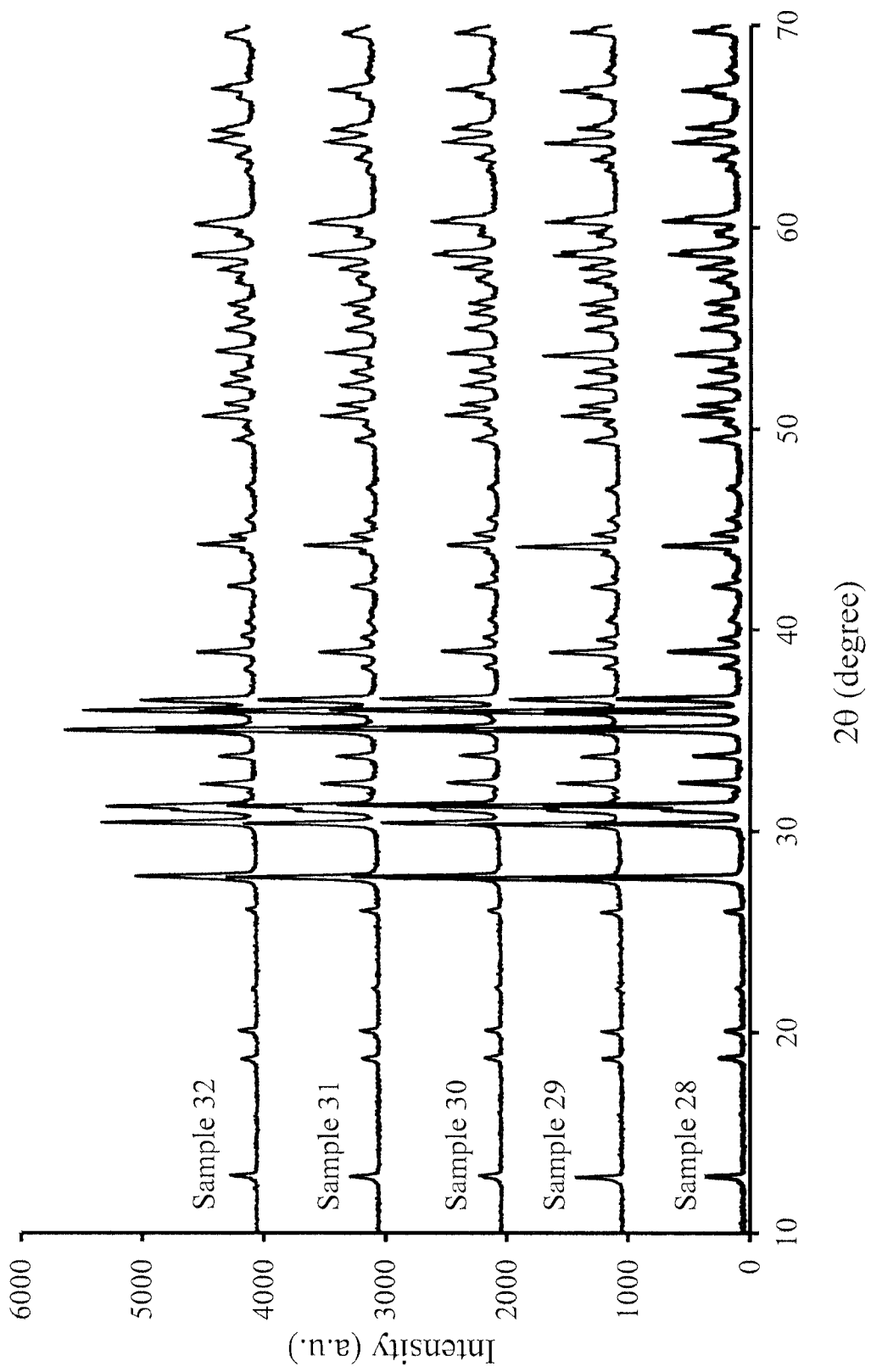
FIG. 21 shows x-ray diffraction patterns of the phosphors from Samples 28 through 32, according to some embodiments of the present invention.

FIG. 20 is the emission spectra of the phosphors from Samples 28 through 32. X-ray diffraction measurements using the $K_\alpha$ line of a Cu target were obtained, and the XRD patterns of Samples 28-32 are shown in FIG. 21.

TABLE 8A

Composition of starting raw materials for Samples 28 through 32

| Compound | $EuCl_3$ | $Sr_3N_2$ | $Ca_3N_2$ | $Si_3N_4$ | AlN |
|---|---|---|---|---|---|
| Sample 28 | 2.5833 | 37.8131 | 0.7412 | 45.3600 | 1.2296 |
| Sample 29 | 2.5833 | 37.8131 | 0.987 | 44.8915 | 1.6396 |
| Sample 30 | 2.5833 | 37.8131 | 1.2356 | 44.4228 | 2.0496 |
| Sample 31 | 2.5833 | 37.8131 | 1.4824 | 43.9572 | 2.4596 |
| Sample 32 | 2.5833 | 37.8131 | 1.9768 | 43.0200 | 3.2792 |

TABLE 8B

Composition and Emission Peak wavelength, Intensity and CIE of Samples 28 through 32

| | | Testing Results | | | |
|---|---|---|---|---|---|
| Sample | Composition | Emission Peak Wavelength (nm) | Intensity (a.u.) | CIE (x) | CIE (y) |
| 28 | $Eu_{0.05}Ca_{0.075}Sr_{1.95}Si_{4.85}Al_{0.15}N_8$ | 629 | 4.002 | 0.641 | 0.358 |
| 29 | $Eu_{0.05}Ca_{0.1}Sr_{1.95}Si_{4.8}Al_{0.2}N_8$ | 629 | 4.046 | 0.644 | 0.356 |
| 30 | $Eu_{0.05}Ca_{0.125}Sr_{1.95}Si_{4.75}Al_{0.25}N_8$ | 630 | 3.621 | 0.639 | 0.360 |
| 31 | $Eu_{0.05}Ca_{0.15}Sr_{1.95}Si_{4.7}Al_{0.3}N_8$ | 631 | 2.864 | 0.637 | 0.362 |
| 32 | $Eu_{0.05}Ca_{0.2}Sr_{1.95}Si_{4.6}Al_{0.4}N_8$ | 633 | 2.497 | 0.637 | 0.362 |

Those of ordinary skill in the art will appreciate that compositions beyond those specifically described above may be made using the methods described above with some different choices of elements. For example, compositions may be made which are represented by the chemical formula $M_{(x/v)}M'_2A_{5-y}D_yN_{8-z}E_p$:RE, wherein: M is at least one monovalent, divalent or trivalent metal with valence v, such as Li, Na, K, Sc, Ca, Mg, Sr, Ba and Y; M' is at least one of Mg, Ca, Sr, Ba, and Zn; A is at least one of Si, C, and Ge; D is at least one of B, Al, and Ga; E is at least one monovalent, divalent or trivalent anion with valence w, such as O, N, F, Cl, Br and I; and RE is at least one of Eu, Ce, Tb, Pr, and Mn; wherein x=y−3z+pw, and wherein the phosphor has the general crystalline structure of $M'_2A_5N_8$:RE.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A red-emitting phosphor comprising a nitride-based composition represented by the chemical formula $Eu_{0.05}Ca_{0.1}Sr_{1.95}Ga_{0.20}Si_{4.80}N_8$, wherein said red-emitting phosphor has the general crystalline structure of $Sr_2Si_5N_8$:Eu, Ga substitutes for Si within said general crystalline structure, and Ca is located within said general crystalline structure substantially at the interstitial sites.

2. A red-emitting phosphor comprising a nitride-based composition represented by the chemical formula $M_{(x/v)}M'_2A_{5-x}D_xE_8$:RE, wherein:
M is at least one monovalent, divalent or trivalent metal with valence v;
M' is at least one of Mg, Ca, Sr, Ba, and Zn;
A is at least one of Si, C and Ge;
D is at least one of B, Al, and Ga;
E is at least one of N, O, F, Cl, Br and I; and
RE is at least one of Eu, Ce, Tb, Pr, and Mn;
wherein x satisfies $0.01 \leq x \leq 1$, and wherein said red-emitting phosphor has the general crystalline structure of $M'_2A_5N_8$:RE, D substitutes for A within said general crystalline structure, and M is located within said general crystalline structure substantially at the interstitial sites.

3. The red-emitting phosphor of claim 2, wherein M is at least one of Li, Na, K, Sc, Ca, Mg, Sr, Ba and Y.

4. The red-emitting phosphor of claim 2, wherein M is Ca, M' is Sr, A is Si, E is N and RE is Eu.

5. The red-emitting phosphor of claim 4, wherein D is Ga.

6. The red-emitting phosphor of claim 2, wherein said red-emitting phosphor comprises Ca, Sr, Si, Ga, N and Eu.

7. The red emitting phosphor of claim 2, wherein said red-emitting phosphor consists of Ca, Sr, Si, Ga, N and Eu.

8. The red-emitting phosphor of claim 7, wherein said red-emitting phosphor is $Ca_{0.1}Sr_{2.0}Ga_{0.20}Si_{4.80}N_8$:Eu.

9. The red-emitting phosphor of claim 2, wherein said red-emitting phosphor is $Eu_{0.05}Ca_{0.1}Sr_{1.95}Ga_{0.20}Si_{4.80}N_8$.

10. A white light illumination source comprising:
an excitation source with emission wavelength within a range from 200 nm to 480 nm;
a red-emitting phosphor according to claim 1, said red-emitting phosphor being configured to absorb excitation radiation from said excitation source and to emit light having a peak emission wavelength greater than about 600 nm; and
at least one of a yellow-emitting phosphor and a green-emitting phosphor.

11. The white light illumination source of claim 10, wherein said at least one of a yellow-emitting phosphor and a green-emitting phosphor has the formula $Ce:Lu_3Al_5O_{12}$.

12. The white light illumination source of claim 10, wherein said excitation source has an emission wavelength within a range from 420 nm to 470 nm.

13. A white light illumination source comprising:
an excitation source with emission wavelength within a range from 200 nm to 480 nm;
a red-emitting phosphor according to claim 2, said red-emitting phosphor being configured to absorb excitation radiation from said excitation source and to emit light having a peak emission wavelength greater than about 600 nm; and
at least one of a yellow-emitting phosphor and a green-emitting phosphor.

14. The white light illumination source of claim 13, wherein said red-emitting phosphor has the formula $Ca_{0.1}Sr_{2.0}Ga_{0.20}Si_{4.80}N_8$:Eu.

15. The white light illumination source of claim 13, wherein said at least one of a yellow-emitting phosphor and a green-emitting phosphor has the formula $Ce:Lu_3Al_5O_{12}$.

16. The white light illumination source of claim 13, wherein said excitation source has an emission wavelength within a range from 420 nm to 470 nm.

\* \* \* \* \*